(12) United States Patent
Harple et al.

(10) Patent No.: US 10,542,624 B2
(45) Date of Patent: Jan. 21, 2020

(54) 3D PRINTED SENSOR AND CUSHIONING MATERIAL

(71) Applicant: Intel Corporation, Santa Clara, CA (US)

(72) Inventors: Todd Sean Harple, Hillsboro, OR (US); Francis Anthony Bitonti, East Moriches, NY (US); Peter Emery Wildfeuer, New York City, NY (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/401,469

(22) Filed: May 2, 2019

(65) Prior Publication Data

US 2019/0261510 A1    Aug. 22, 2019

Related U.S. Application Data

(63) Continuation of application No. 15/679,987, filed on Aug. 17, 2017, now Pat. No. 10,285,267.

(51) Int. Cl.
| | |
|---|---|
| *H05K 1/00* | (2006.01) |
| *H05K 1/03* | (2006.01) |
| *H05K 3/12* | (2006.01) |
| *H05K 1/16* | (2006.01) |
| *B33Y 10/00* | (2015.01) |
| *B33Y 80/00* | (2015.01) |

(52) U.S. Cl.
CPC .......... *H05K 1/0393* (2013.01); *H05K 1/162* (2013.01); *H05K 3/1275* (2013.01); *B33Y 10/00* (2014.12); *B33Y 80/00* (2014.12); *B41P 2217/50* (2013.01); *G06F 2203/04103* (2013.01); *H05K 2201/0129* (2013.01)

(58) Field of Classification Search
CPC ...................................................... H05K 1/393
USPC ...................................................... 174/113 R
See application file for complete search history.

(56) References Cited

U.S. PATENT DOCUMENTS

| | | |
|---|---|---|
| 2013/0298316 A1 | 11/2013 | Jacob |
| 2015/0091859 A1* | 4/2015 | Rosenberg .............. G06F 3/044 345/174 |

(Continued)

FOREIGN PATENT DOCUMENTS

EP    3051445 A1    8/2016

OTHER PUBLICATIONS

Sommer et al., "3D printing of concentrated emulsions into multiphase biocompatible soft materials," Soft Matter Journal, published on Jan. 30, 2017, 5 pages.

(Continued)

*Primary Examiner* — Stanley Tso
(74) *Attorney, Agent, or Firm* — Hanley, Flight and Zimmerman, LLC

(57) ABSTRACT

Methods, apparatus, systems and articles of manufacture are disclosed relating to 3D-printed structures. An example method of building a sensor with a 3D printer includes building a first conductive substrate and building a second conductive substrate. The example method also includes building a dielectric structure between the first conductive substrate and the second conductive substrate, the dielectric structure including a first latticed structure including a first plurality of legs extending inwardly at a first angle and a second latticed structure including a second plurality of legs extending inwardly at a second angle.

21 Claims, 24 Drawing Sheets

(56) References Cited

U.S. PATENT DOCUMENTS

| | | | |
|---|---|---|---|
| 2016/0284811 A1* | 9/2016 | Yu | H01L 29/454 |
| 2017/0125908 A1* | 5/2017 | Pance | H01Q 9/0485 |
| 2017/0224538 A1* | 8/2017 | Alhammadin et al. | |
| | | | A61F 13/0233 |
| 2018/0029290 A1* | 2/2018 | Bottiglio | H05K 1/16 |
| 2018/0061743 A1* | 3/2018 | Hsu | H05K 1/189 |
| 2019/0059155 A1 | 2/2019 | Harple et al. | |

OTHER PUBLICATIONS

Truby et al., "Printing soft matter in three dimensions," Nature Magazine, published on Dec. 15, 2016, vol. 540, 8 pages.

Thimmesch, Debra, "UCLA and Architected Materials 3D Print Protective Material for Helmets, in NFL's Head Health Challenge," 3D PrintBoard.com, published on Dec. 8, 2014, 4 pages.

Lockwood, Anthony J., "Solver Optimizes Lattice Structures for 3D Printing," Digital Engineering, published on Mar. 18, 2015, 3 pages.

United States Patent and Trademark Office, "Requirement for Restriction," issued in connection with U.S. Appl. No. 15/679,987, dated Jan. 25, 2018, 7 pages.

United States Patent and Trademark Office, "Non-Final Office action," issued in connection with U.S. Appl. No. 15/679,987, dated May 16, 2018, 24 pages.

United States Patent and Trademark Office, "Final Office action," issued in connection with US. Appl. No. 15/679,987, dated Oct. 15, 2018, 12 pages.

United States Patent and Trademark Office, "Notice of Allowance," issued in connection with U.S. Appl. No. 15/679,987, dated Dec. 28, 2018, 20 pages.

* cited by examiner

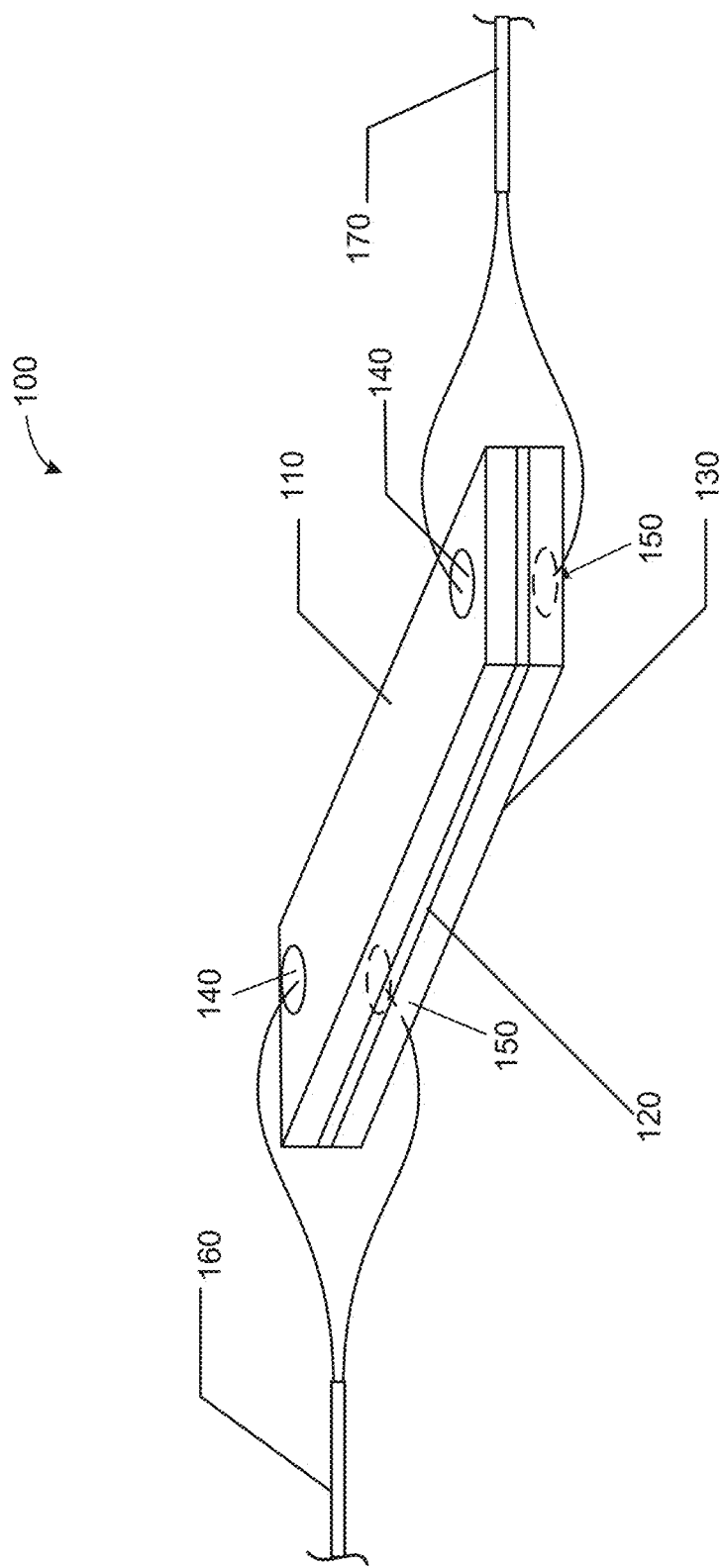

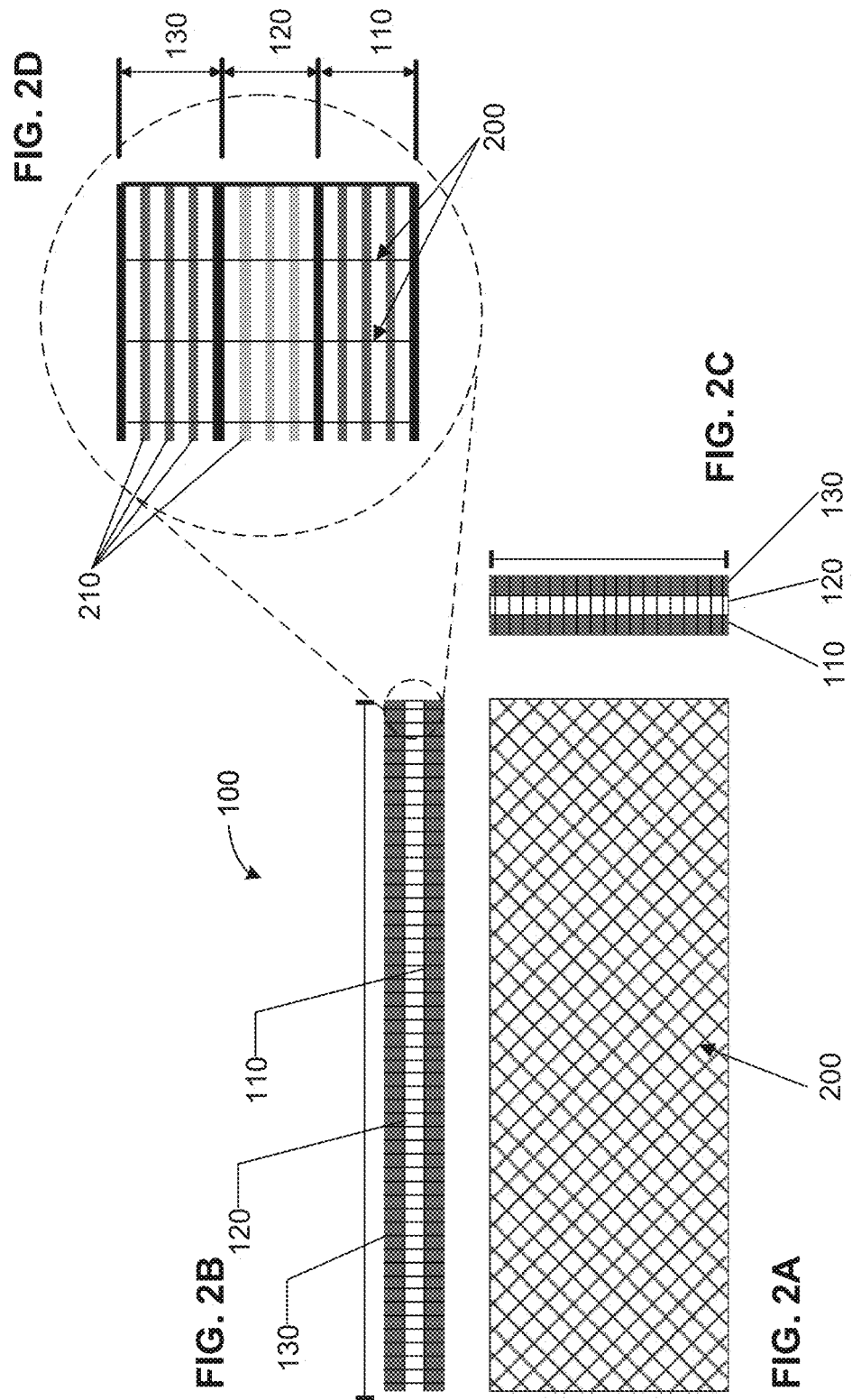

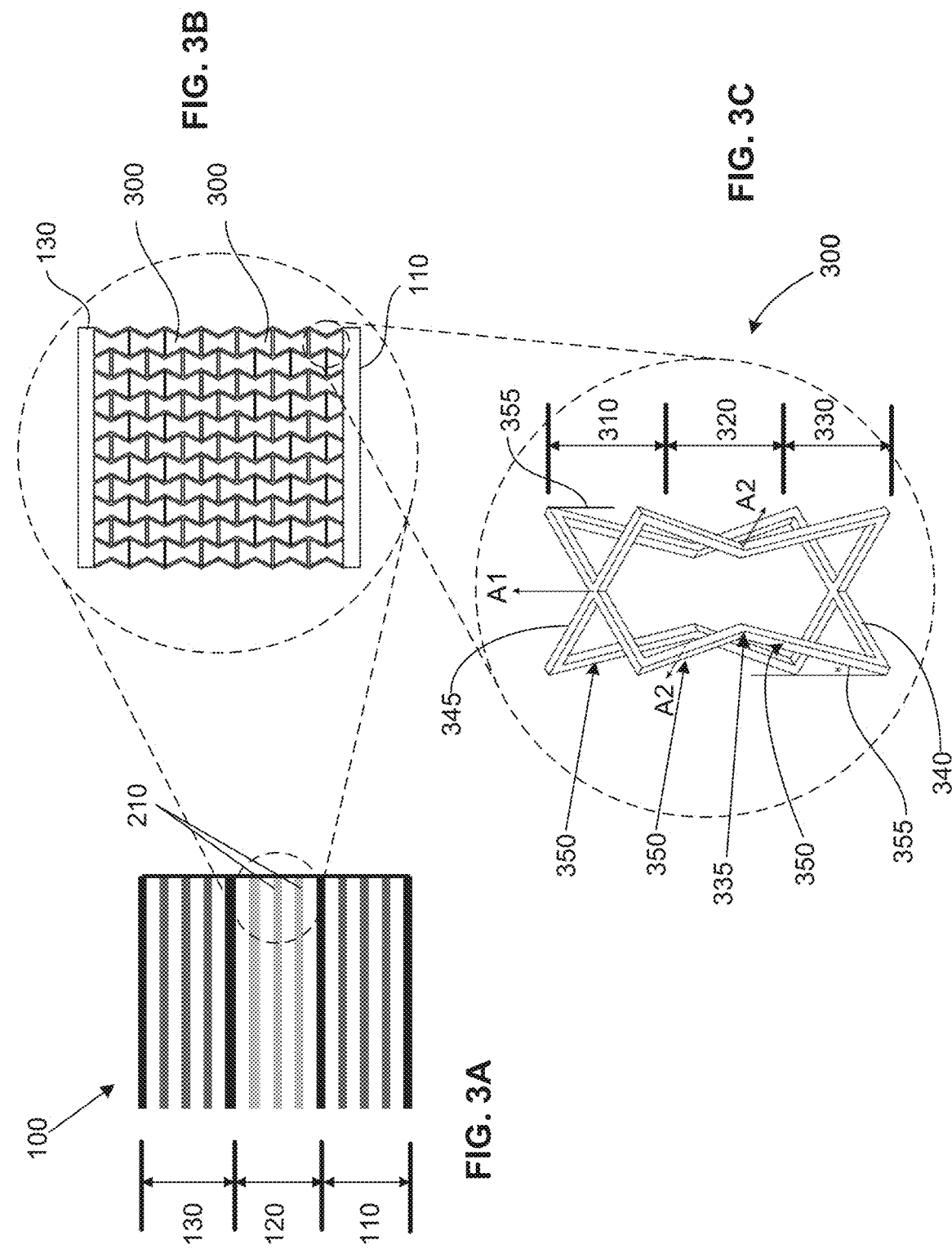

US 10,542,624 B2

3D PRINTED SENSOR AND CUSHIONING MATERIAL

RELATED APPLICATION

This patent arises from a continuation of U.S. patent application Ser. No. 15/679,987, which was filed on Aug. 17, 2017, and which is hereby incorporated herein by reference in its entirety.

FIELD OF THE DISCLOSURE

This disclosure relates generally to sensors, and, more particularly, to a 3D printed sensor and cushioning material.

BACKGROUND

In recent years, 3D printing or additive manufacturing (AM) systems have emerged that execute instructions on a computer to form a specific three-dimensional object indicated by the instructions by iteratively building the three-dimensional object layer-by-layer.

BRIEF DESCRIPTION OF THE DRAWINGS

FIG. 1 is a schematic illustration of an example 3D-printed structure in accordance with some teachings of this disclosure.

FIGS. 2A-2F are schematic illustrations of example 3D-printed structures in accordance with FIG. 1 and in accordance with some teachings of this disclosure.

FIGS. 3A-3C are schematic illustrations of the example 3D-printed structure in accordance with the examples of FIGS. 1 and 2A-2D and in accordance with some teachings of this disclosure.

The figures are not to scale. Wherever possible, the same reference numbers will be used throughout the drawing(s) and accompanying written description to refer to the same or like parts.

DETAILED DESCRIPTION

Figure 2E:
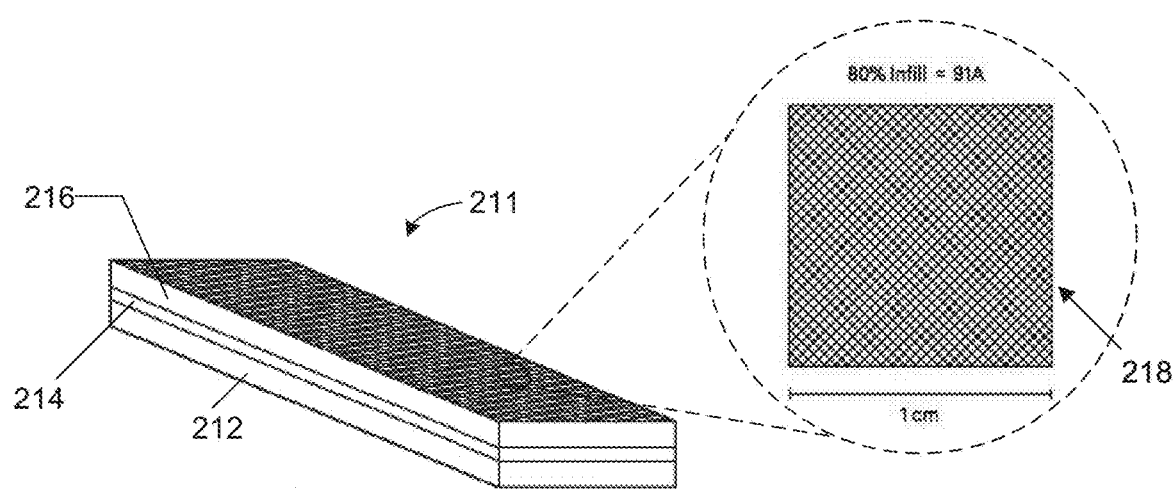

FIG. 1 is a schematic illustration of an example 3D-printed structure 100 in accordance with some teachings of this disclosure. The example 3D-printed structure 100 includes an example first conductive substrate 110, an example dielectric structure 120, and an example second conductive substrate 130. The dielectric structure 120, disposed between the first conductive substrate 110 and the second conductive substrate 130, includes a latticed structure having a first stiffness in a first direction and a second stiffness in a second direction different than the first direction.

In some examples, the first conductive substrate 110 and/or the second conductive substrate 130 includes conductive carbon nanotube (CNT) filaments (e.g., approximately 10% CNT, etc.), graphene, graphide, nano metallization, silver nano wire and/or copper. For instance, the first conductive substrate 110 and/or the second conductive substrate 130 can include an elastomeric polymer composite including CNT filaments. In some examples, the dielectric structure 120 includes an elastomeric polyurethane (EPU), a thermoplastic polyurethane (TPU), and/or a thermoplastic elastomer (TPE). In some examples, the dielectric structure 120 includes an aliphatic TPU.

FIG. 1 shows example first electrical connectors 140 built in the first conductive substrate 110 and example second electrical connectors 150 built in the second conductive substrate 130. The 3D-printed structure 100 of FIG. 1 is operatively integrated into a circuit, such as an example sensor circuit, via example leads 160, 170 or metallizations connected to the first electrical connectors 140 and the second electrical connectors 150.

FIGS. 2A-2D depict views of the example 3D-printed structure 100 of FIG. 1. FIG. 2A is a top view of the example 3D-printed structure 100 of FIG. 1 showing an example first infill pattern 200 corresponding to an infill percentage of approximately 10% (+/−1%). The infill pattern relates to the relative hardness (e.g., Shore hardness) and flexibility of the material. FIG. 2B is a side view of the example 3D-printed structure 100 of FIG. 1 showing the first conductive substrate 110, the dielectric structure 120, and the second conductive substrate 130. FIG. 2C is a front view of the example 3D-printed structure 100 of FIG. 1 showing the first conductive substrate 110, the dielectric structure 120, and the second conductive substrate 130. FIG. 2B and FIG. 2C show example patterning corresponding to the first infill pattern 200. In other examples, patterning of any of the first conductive substrate 110, the dielectric structure 120 or the second conductive substrate 130 may differ from any other one or more of the first conductive substrate 110, the dielectric structure 120 or the second conductive substrate 130. For instance, the first conductive substrate 110, the dielectric structure 120 and the second conductive substrate 130 may each have a different infill pattern and/or infill percentage. The example first infill pattern 200, having an infill of approximately 10%, corresponds to a Shore hardness of about 44A.

FIG. 2D shows an exploded view of a portion of FIG. 2B including the first conductive substrate 110, the dielectric structure 120 and the second conductive substrate 130. FIG. 2D shows the first conductive substrate 110, the dielectric structure 120 and the second conductive substrate 130 each include a plurality of layers 210 that are iteratively applied, layer-by-layer, to form the 3D-printed structure 100. In some examples, a layer height of each of the layers to build the first conductive substrate 110, the dielectric structure 120 and/or the second conductive substrate 130 is between approximately 0.06 mm-0.10 mm. In some examples, a thickness of the first conductive substrate 110, the dielectric structure 120 and/or the second conductive substrate 130 is between 0.1 mm-1.5 mm.

FIG. 2E shows a perspective view of an example 3D-printed structure 211 having an example first conductive substrate 212, an example dielectric structure 214 and an example second conductive substrate 216 similar to that of corresponding structures in the example 3D-printed structure 100 of FIGS. 1-2D. As shown in the enlarged view at the right of FIG. 2E, the first conductive substrate 212 of the 3D-printed structure 211 of FIG. 2E has an example second infill pattern 218 corresponding to an infill percentage of approximately 80% (+/−2%) and a Shore hardness of 91A. The dielectric structure 214 and the second conductive substrate 216 of the 3D-printed structure 211 can have an infill pattern and/or percentage similar to, or different from, the first conductive substrate 212.

Figure 2F:
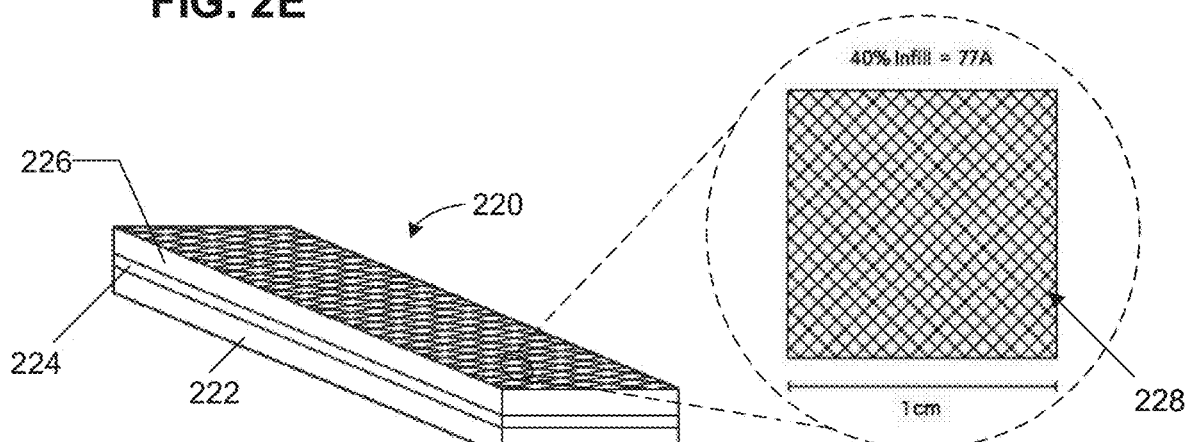

FIG. 2F shows a perspective view of an example 3D-printed structure 220 having an example first conductive substrate 222, an example dielectric structure 224 and an example second conductive substrate 226 similar to that of corresponding structures in the example 3D-printed structure 100 of FIGS. 1-2D. As shown in the enlarged view at the right of FIG. 2F, the first conductive substrate 222 of the 3D-printed structure 220 of FIG. 2F has an example second infill pattern 228 corresponding to an infill percentage of approximately 40% (+/−1%) and a Shore hardness of 77A. The dielectric structure 224 and the second conductive substrate 226 of the 3D-printed structure 220 can have an infill pattern and/or percentage similar to, or different from, the first conductive substrate 222.

FIGS. 3A-3C depict the example 3D-printed structure 100 of FIGS. 1 and 2A-2D. FIG. 3A shows the layered structure of the 3D-printed structure 100, as shown in FIG. 2D. A portion of the dielectric structure 120 of FIG. 3A is enlarged in FIG. 3B to show that the dielectric structure 120 includes an example homogenous structure of a plurality of example unit cells 300 arranged in an example array to form a lattice structure. A portion of the dielectric structure 120 of FIG. 3B is enlarged in FIG. 3C to show that an example structure for the unit cells 300. The unit cell 300 includes an example upper portion 310, an example middle portion 320 and an example lower portion 330 defining an hourglass shape with lateral dimensions of the middle portion 320 being smaller than lateral dimensions of the lower portion 330 and the upper portion 310. In some examples, the unit cell 300 includes two oppositely oriented conic sections or truncated cones joined at a position between the apex and the base of the respective cones. The example upper portion 310, the example middle portion 320 and the example lower portion 330 are shown to be symmetric about a junction 335 of the example upper portion 310 and the example lower portion 330. In some examples, the unit cell 300 may be asymmetric with a junction 335 displaced upwardly or downwardly from the illustrated example of FIG. 3C.

In the example of FIG. 3C, the unit cell 300 includes an example base structure 340, an example top structure 345, and example legs 350 extending between the base structure 340 and the top structure 345. The legs 350 extend inwardly by an example bend angle 355 from a vertical toward the middle portion 320 or junction 335 between the base structure 340 and the top structure 345. In FIG. 3C, the bend angle 355 of the legs 350 relative to the base structure 340 is the same as the bend angle 355 of the legs 350 relative to the top structure 345. In an example asymmetric unit cell 300, a bend angle 355 of the legs 350 relative to the base structure 340 can differ from the bend angle 355 of the legs 350 relative to the top structure 345.

In FIG. 3C, an arrow A1 extending from the top structure 345 represents an example tensile force acting on the top structure 345 and arrows A2 extending from the junctions 335 of two of the legs 350 represent example displacement vectors for the legs 350 responsive to application of the tensile force A1. While four legs 350 are shown in FIG. 3C, the unit cell 300 may include a greater number of legs 350, or a lesser number of legs 350. In some examples, the bend angle 355 is between approximately 10°-35° from the vertical (e.g., 10°, 14.92°, 15°, 20°, 25°, 30°, 32.25°, etc.).

Figure 4A:
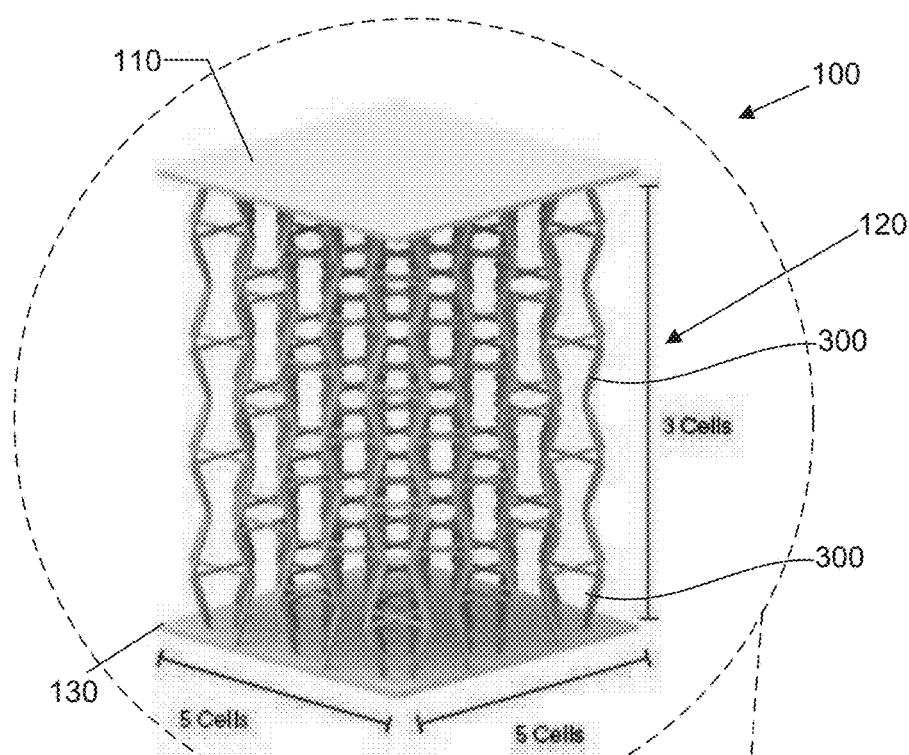
FIGS. 4A-4B are schematic illustrations of the example 3D-printed structure in accordance with the example of FIGS. 1, 2A-2D and 3A-3C and in accordance with some teachings of this disclosure.
Figure 4B:
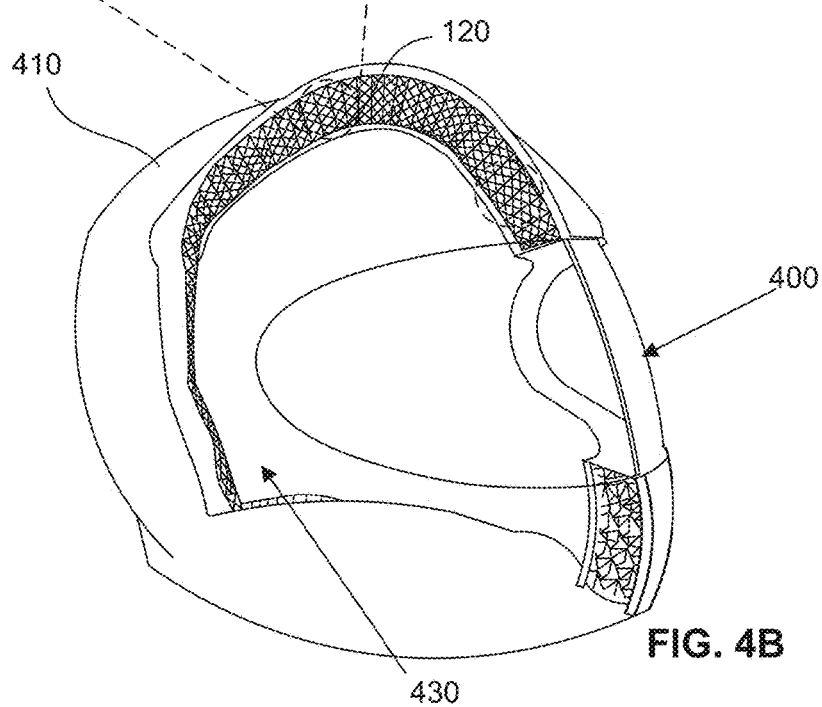

FIGS. 4A-4B are schematic illustrations of the example 3D-printed structure in accordance with the example of FIGS. 1, 2A-2D and 3A-3C and in accordance with some teachings of this disclosure. FIG. 4A is a portion of the 3D-printed structure 100, showing the first conductive substrate 110, or a portion thereof, the dielectric structure 120, and the second conductive substrate 130, or a portion thereof. The portion of the dielectric structure 120 illustrated is an array, wherein the unit cell 300 is replicated along three axes to form an array of unit cells 300. In some examples, the unit cells 300 are vertically staggered, as shown for example in FIG. 3B, so that a lower portion 330 of one unit cell 300 is aligned with an upper portion 310 of adjacent unit cells 300.

FIG. 4B shows that the portion of the 3D-printed structure 100 represented in FIG. 4A is incorporated into an example helmet 400 having an example outer shell 410 made from aramide polyethylene, polycarbonate, fiberglass and/or Kevlar and an inner liner 420, which may include a hard shell of a material similar to the outer shell 410 and/or an expanded polystyrene, a polypropylene (EPS) foam and/or an insulating layer. The 3D-printed structure 100 is disposed between the outer shell 410 and the inner liner 420 with the first conductive substrate 110 and the second conductive substrate 130 connected, via leads or metallizations, to a voltage source.

In some examples, a plurality of addressable 3D-printed structures 100 are provided in an array. For instance, the helmet 400 may include two or more (e.g., fore/aft, left/right, etc.), or even tens of, or hundreds of, separately addressable 3D-printed structures 100. These 3D-printed structures 100 may occupy the entire space between the outer shell 410 and the inner liner 420, or only a portion thereof. For instance, a plurality of 3D-printed structures 100 can be formed interspersed between a shock absorbing material such as, but not limited to, an expanded polystyrene (EPS) foam. The 3D-printed structures 100 may assume any form factor(s) (e.g., square, rectangle, strip, triangle, etc.) or tiles to occupy a desired geometry and may be continuous or discontinuous in distribution.

The 3D-printed structures 100 in the array absorb force via compression of the dielectric structure 120 and serve to identify a location of and an intensity of force, by virtue of a change in capacitance and/or a rate of change in capacitance (e.g., a change in voltage) arising from a strain in one or more dielectric structures 120 of one or more 3D-printed structures 100. The change in capacitance and/or the rate of change in capacitance is correlatable to the force. For instance, application of a compressive force to the 3D-printed structure 100, via a strain of the outer shell 410 of the helmet 400, causes a corresponding strain in the dielectric structure 120, which decreases a spacing between the first conductive substrate 110 and the second conductive substrate 130 and increases a capacitance. Data from the 3D-printed structures 100 can thus be used to provide a detailed understanding of impact locations and forces on the helmet 400. Similarly, one or more 3D-printed structures 100 can be integrated into medical orthotics (e.g., braces, footwear inserts, etc.), shipping materials, protective cases, sports equipment, and/or footwear.

Figures 5A, 5B:
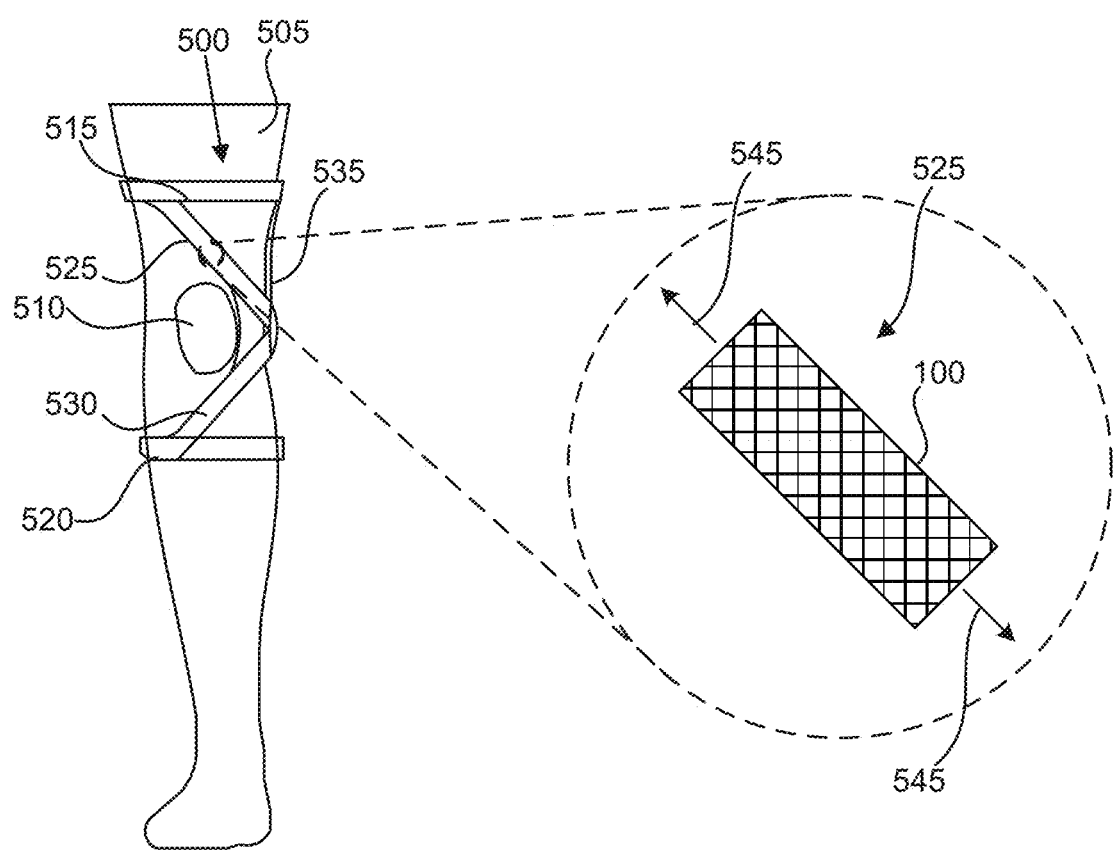
FIGS. 5A-5B illustrate an example application of an example 3D-printed structure in accordance with the examples of FIGS. 1-4B and in accordance with some teachings of this disclosure.

FIGS. 5A-5B illustrate an example application of an example 3D-printed structure 100 in an example leg brace 500 disposed about a user's leg 505 to be roughly symmetric with respect to the user's knee 510. An example first securement member 515 (e.g., a strap having an adjustment device and/or a closure device, an elastic band, etc.) is disposed above the knee 510 to serve as an anterior/posterior thigh anchor and an example second securement member 520 is disposed below the knee 510 to serve as an anterior/posterior tibial anchor. An example first anterior strap 525 is attached at a proximal end to the first securement member 515 and at a distal end to an example lateral securement member 535 extending between the first securement member 515 and the second securement member 520. An example second anterior strap 530 is attached at a proximal end to the second securement member 520 and at a distal end to the example lateral securement member 535. The first anterior strap 525 is shown to include, in FIG. 5B, a 3D-printed structure 100 constructed to determine tensile forces 545 across the first anterior strap 525 during movement of the user. In some examples, the 3D-printed structure 100 is integrated into a sensor circuit. In some examples, the sensor circuit including the 3D-printed structure 100 is constructed to store data output by the 3D-printed structure 100 in a local memory device, to transmit data from the 3D-printed structure 100 and/or to provide feedback to the user and/or a medical care provider via an output device (e.g., a display device, a speaker, a haptic device, etc.).

Figure 5C:
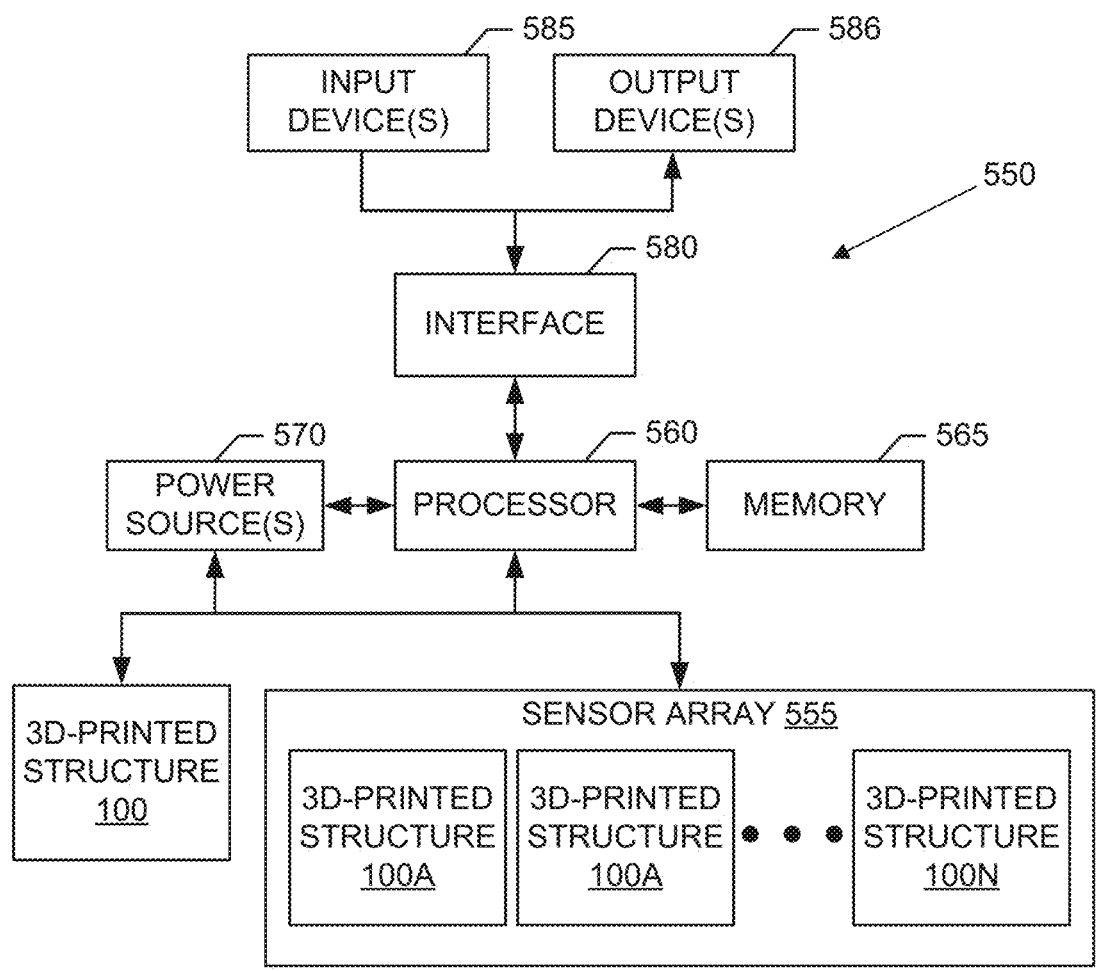
FIG. 5C illustrates an example application of one or more example 3D-printed structures used in an example circuit in accordance with the examples of FIGS. 1-5B and in accordance with some teachings of this disclosure.

FIG. 5C illustrates an example application of one or more example 3D-printed structures 100 used in an example circuit 550 in accordance with the examples of FIGS. 1-5B. The example circuit 550 can relate to the example application of FIGS. 5A-5B or to any other application using the example 3D-printed structure 100 and/or an example sensor array 555 of 3D-printed structures 100A, 100B . . . 100N, where N is any integer, such as, but not limited to, a sensor circuit for a garment, footwear, protective equipment, shock absorbing device(s), orthotic device(s), prosthetic device(s), shipping material, packing material and/or padding. An example processor 560 receives signals output by the example 3D-printed structure 100 and/or the example 3D-printed structures (e.g., 100A, 100B, . . . 100N) of the example sensor array 555. In some examples, an example memory 565 is operatively associated with the example processor 560. The example memory 565 may include, for example, a mapping of the sensor array 555 and/or other location information for the example 3D-printed structure 100 and/or the example 3D-printed structures (e.g., 100A, 100B, . . . 100N) of the example sensor array 555. The example memory 565 may include, for example, a mapping of strain(s) of each 3D-printed structure 100 along one or more axes relative to applied force(s). The example processor 560, the example sensor array 555 and/or the example 3D-printed structure 100 are powered by one or more example power source(s) 570. The example circuit 550 can include an interface 580 such as an Ethernet interface, a universal serial bus (USB), a wireless network interface controller (WINC), a network interface controller (NIC), and/or a PCI express interface. In the example circuit 550, one or more input devices 585 (e.g., a microphone, a keyboard, a keypad, a button, a touchscreen, etc.) are connected to the interface 580 to permit a user to enter data and/or commands into the processor 560 and one or more output devices 586 (e.g., a speaker, a display device, a haptic device, etc.) are connected to the interface 580 to permit the processor 560 to communicate information to a user.

Figure 6A:
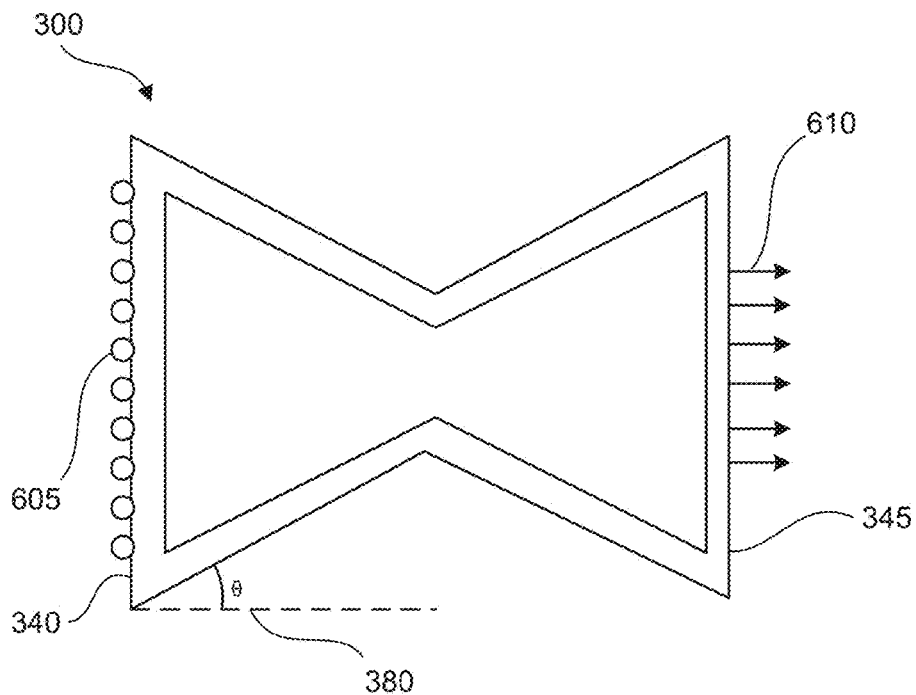
FIGS. 6A-6B are schematic illustrations of a free body diagram of an example unit cell of the example 3D-printed structure before application of an axial force and after application of an axial force, respectively, in accordance with the example of FIG. 3 and in accordance with some teachings of this disclosure.
Figure 6B:
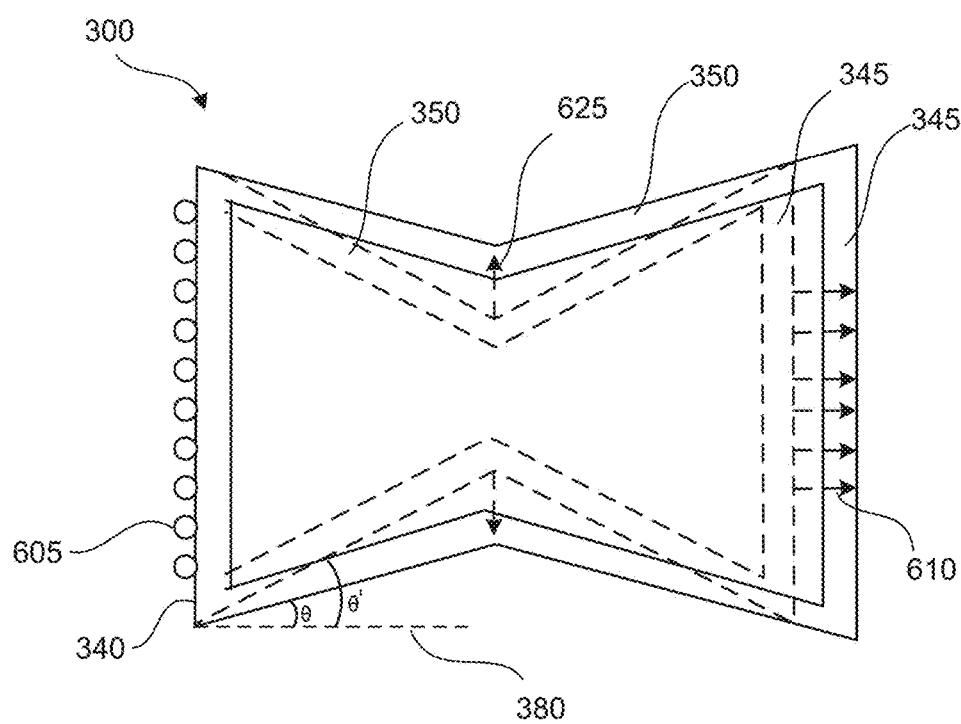

FIGS. 6A-6B are example free body diagrams of a unit cell 300 of the dielectric structure 120 of the 3D-printed structure 100. In FIG. 6A, a base structure 340 of the unit cell 300 is constrained, as indicated by the uniformly distributed circles 605, and an axial force 610 is applied to a top structure 345 of the unit cell 300. FIG. 6A shows a bend angle 380 of 0. FIG. 6B shows, in dashed lines, an original state of the unit cell 300 before application of the axial force 610, such as shown in FIG. 6A. FIG. 6B also shows, in solid lines, a state of the unit cell 300 after the application of the axial force 610. In the example of FIGS. 6A-6B, the unit cell 300 is an auxetic structure having a negative Poisson ratio, wherein a positive strain along the axial direction in the direction of the axial force 610 generates a positive transverse strain 625 in the unit cell 300, increasing the cross-sectional area under the axial strain to outwardly expand the legs 350 and decrease the bend angle 380 from θ to θ'.

Figure 6C:
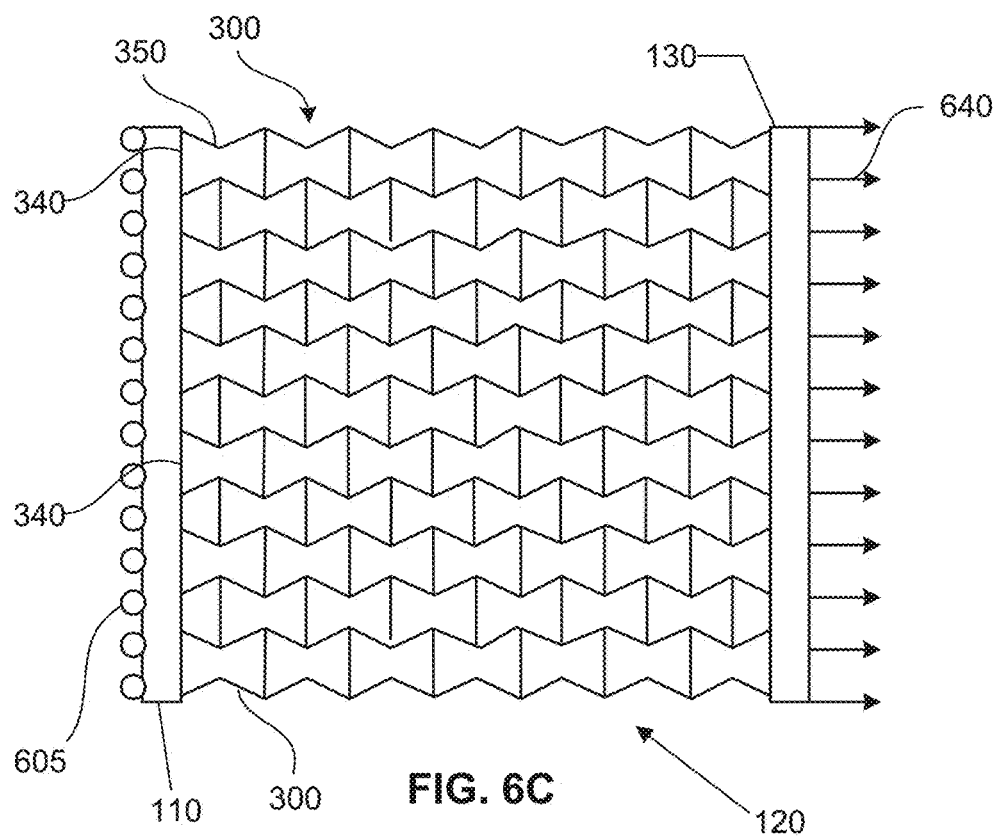
FIGS. 6C-6D are schematic illustrations of a free body diagram of an example array of unit cells of the example 3D-printed structure before application of an axial force and after application of an axial force, respectively, in accordance with the example of FIG. 3 and in accordance with some teachings of this disclosure.
Figure 6D:
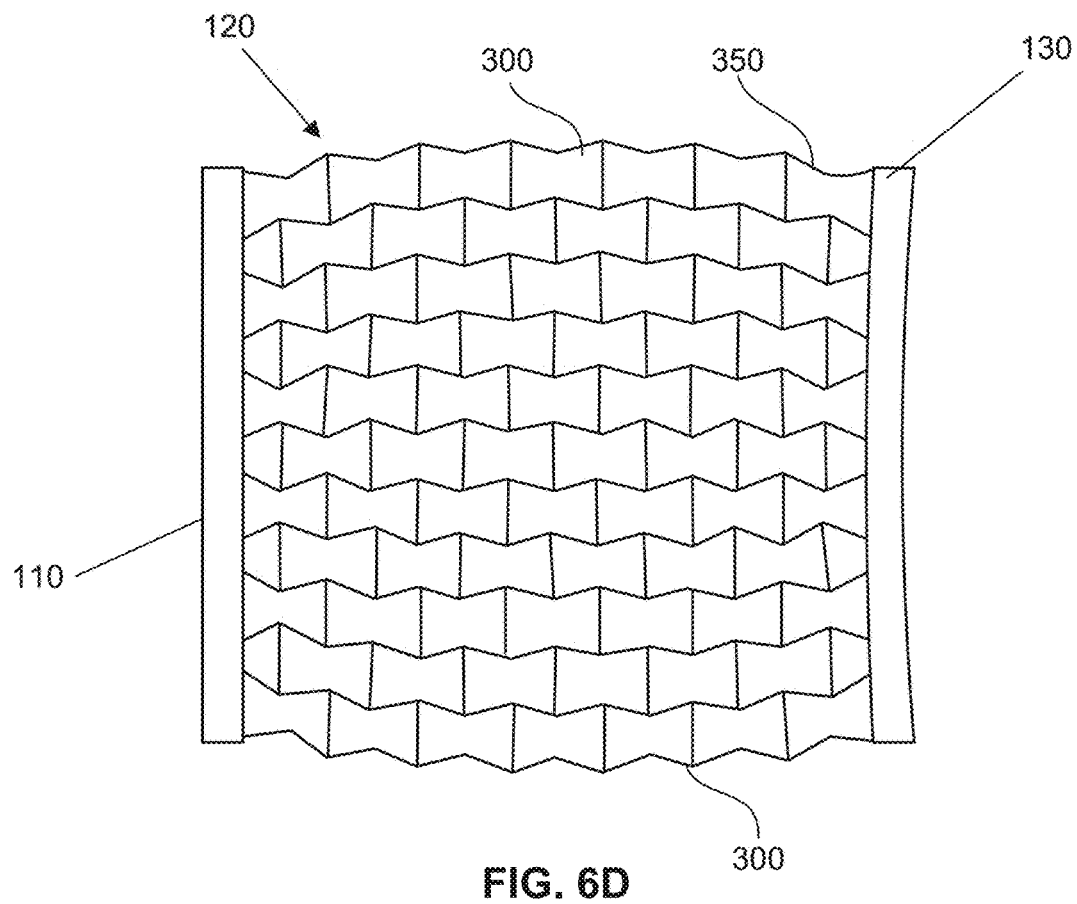

FIGS. 6C-6D show, similar to FIGS. 6A-6B, a free body diagram of an example array of unit cells 300 of the dielectric structure 120 of a 3D-printed structure 100 before application of an axial force (FIG. 6C) and after application of an axial force (FIG. 6D). In FIG. 6C, base structures 340 of the unit cells 300 and the second conductive substrate 130 are constrained, as indicated by the uniformly distributed circles 605, and an axial force 640 is applied to the first conductive substrate 110, or another layer attached thereto, to impart an axial force on the array of unit cells 300.

FIG. 6D shows a state of the array of unit cells 300 after the application of the axial force 640. In the example of FIGS. 6C-6D, as with FIGS. 6A-6B, the unit cells 300 in the array of unit cells 300 are auxetic structures that exhibit a positive transverse strain responsive to the positive strain along the axial direction in the direction of the axial force 640, and increase in cross-sectional area under the axial strain with outward expansion of the legs 350 of the respective unit cells 300 and with a decrease in the bend angles 380 of the respective unit cells 300.

Figure 7A:
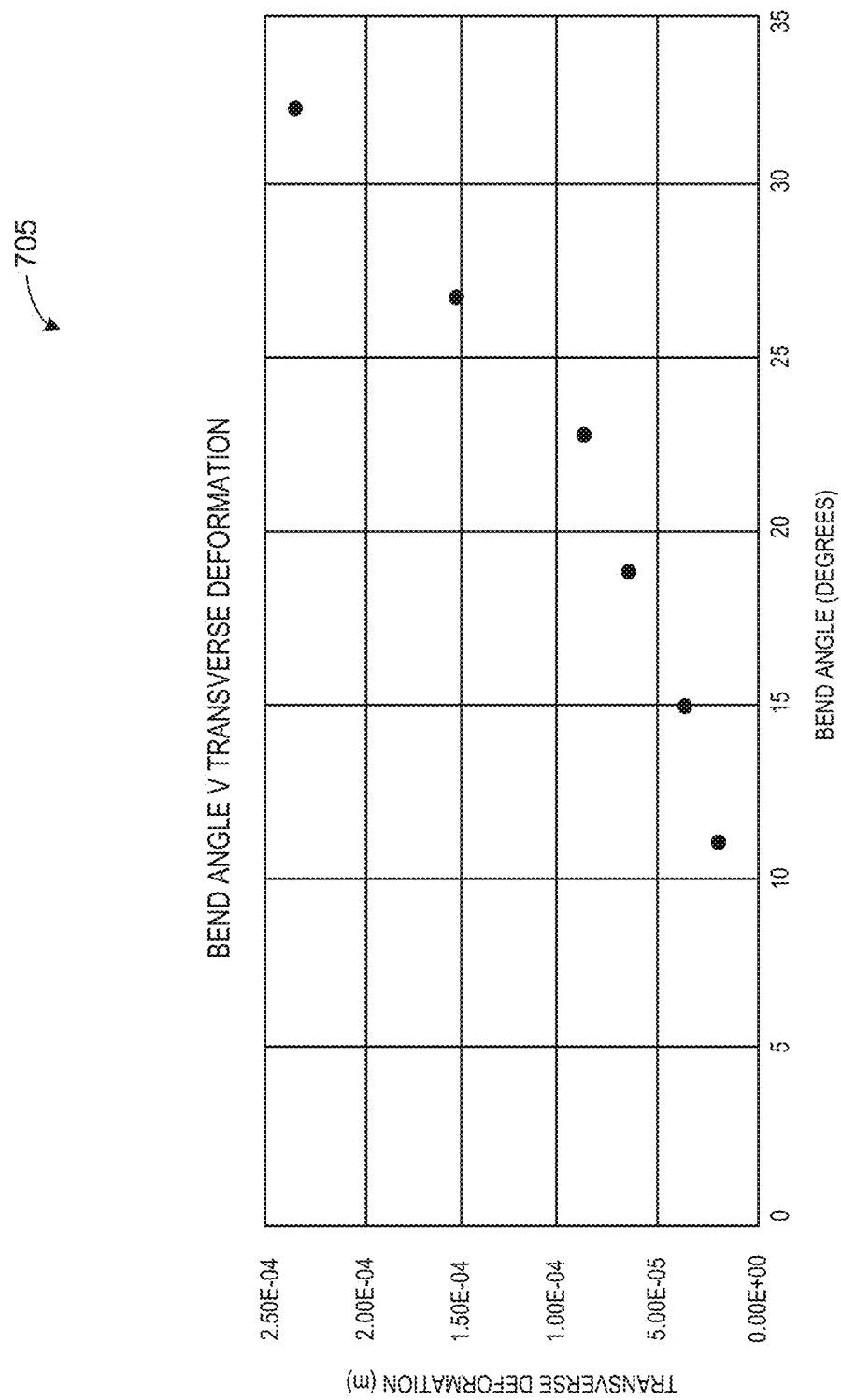
FIGS. 7A-7C illustrate, respectively, an example plot of bend angle versus transverse displacement for the example unit cell of FIGS. 6A-6B, an example plot of bend angle versus axial deformation for the example unit cell of FIGS. 6A-6B, and an example plot of bend angle versus negative Poisson Ratio for the example unit cell of FIGS. 6A-6B.
Figure 7B:
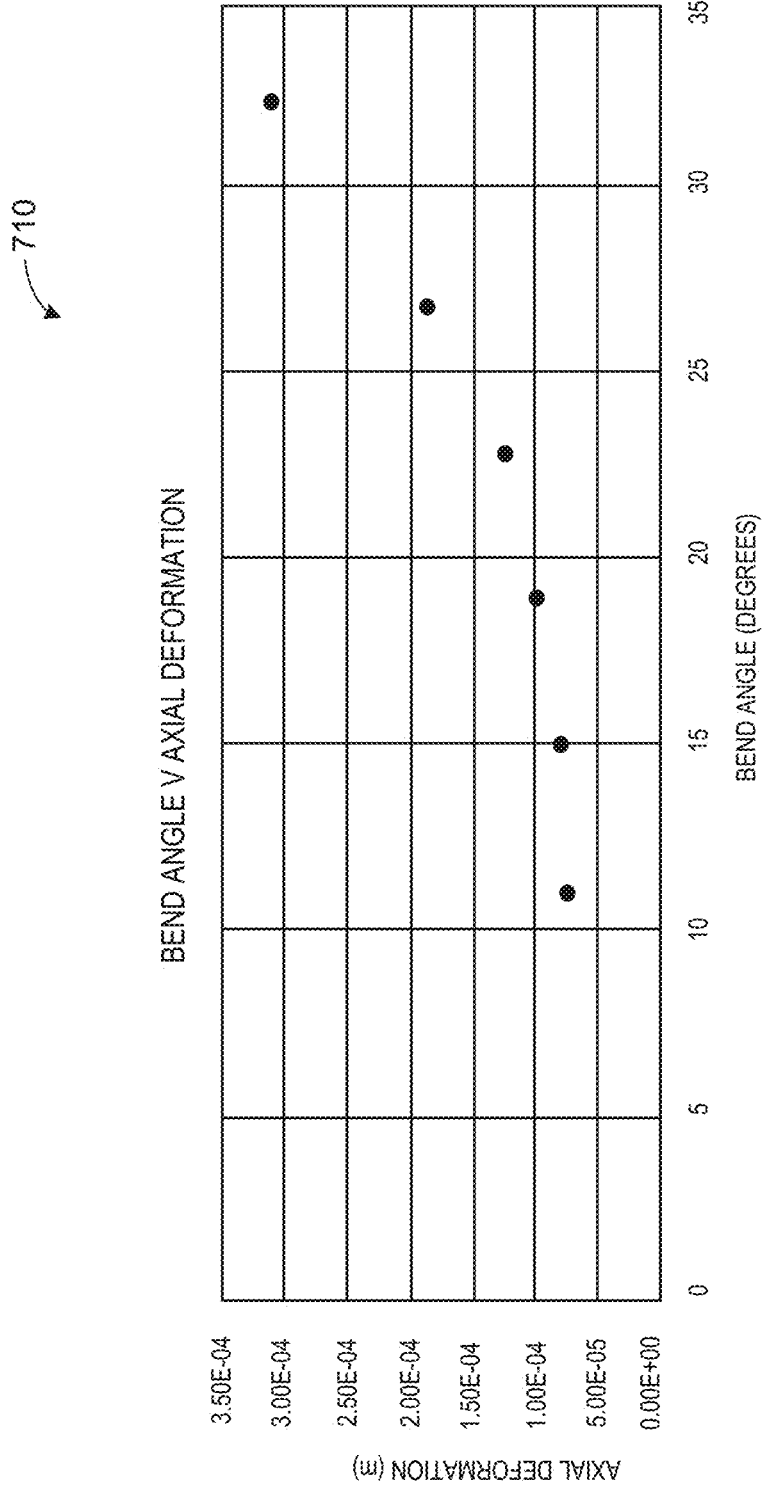
Figure 7C:
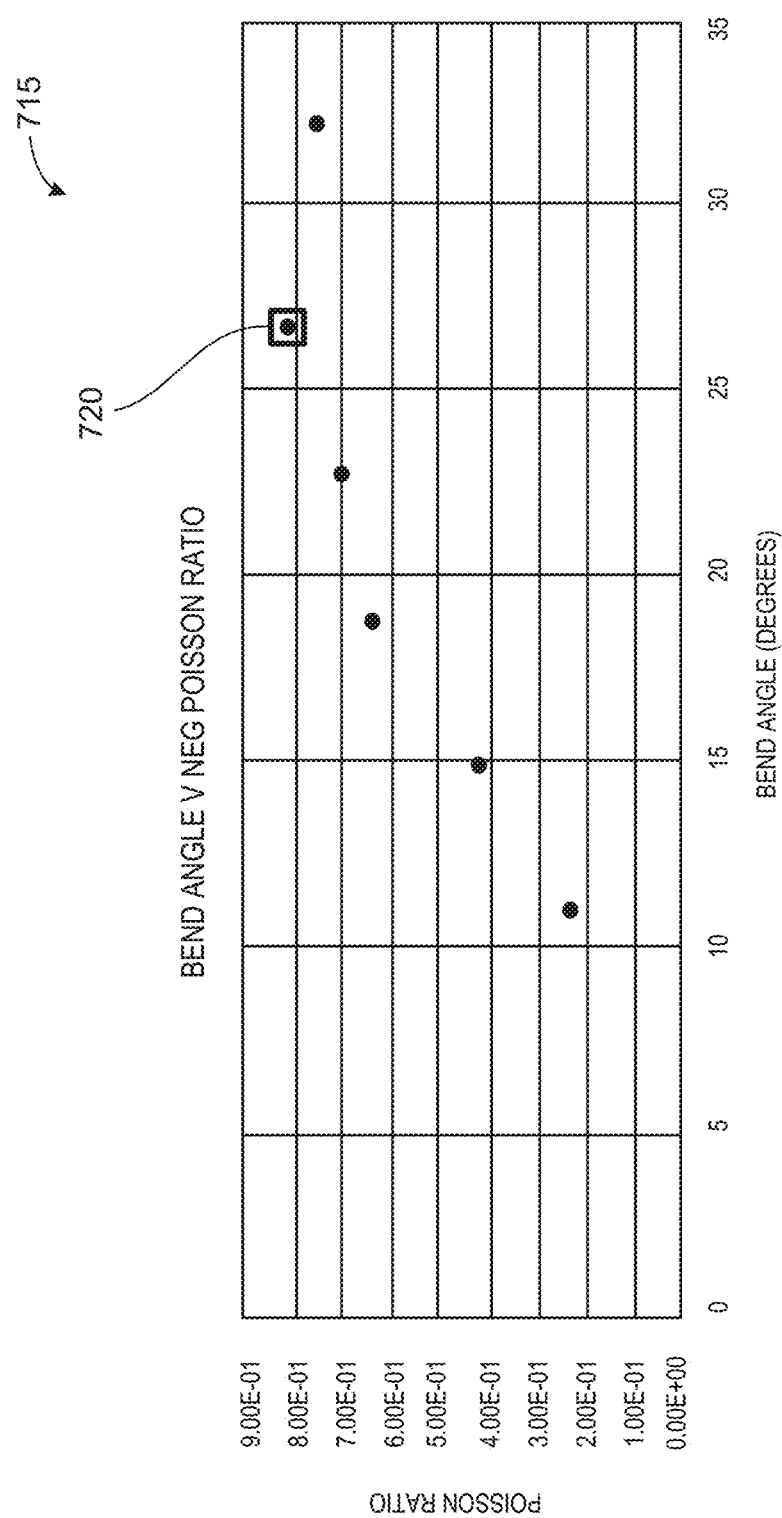

FIG. 7A illustrates an example plot 705 of bend angle (in degrees) versus transverse deformation (in meters) for the example unit cell 300 of FIGS. 6A-6B and FIG. 7B illustrates an example plot 710 of bend angle (in degrees) versus axial deformation (in meters) for the example unit cell of FIGS. 6A-6B. At an example bend angle of 11.97 degrees, the transverse deformation is 7.90E-06 meters with an axial deformation of 4.09E-05 meters. At an example bend angle of 16.59 degrees, the transverse deformation is 1.79E-05 meters with an axial deformation of 7.56E-05 meters. At an example bend angle of 21.00 degrees, the transverse deformation is 3.50E-05 meters with an axial deformation of 8.20E-05 meters. At an example bend angle of 25.16 degrees, the transverse deformation is 6.46E-05 meters with an axial deformation of 1.00E-04 meters. At an example bend angle of 29.06 degrees, the transverse deformation is 8.83E-05 meters with an axial deformation of 1.25E-04 meters. At an example bend angle of 32.68 degrees, the transverse deformation is 1.53E-04 meters with an axial deformation of 1.86E-04 meters. At an example bend angle of 36.03 degrees, not shown in FIGS. 7A-7B, the transverse deformation is 2.36E-04 meters with an axial deformation of 3.11E-04 meters. FIGS. 7A-7B show that, as the bend angle increase, the axial displacement increases at a greater rate than the transverse displacement. FIG. 7C illustrates an example plot 715 of bend angle versus negative Poisson Ratio for the example unit cell of FIGS. 6A-6B. For the noted example bend angles of 11.97 degrees, 16.59 degrees, 21.00 degrees, 25.16 degrees, 26.09 degrees, 32.68 degrees and 36.03 degrees the calculated Poisson ratios are, respectively, 0.193, 0.237, 0.427, 0.646, 0.706, 0.823 and 0.759. Accordingly, there is an optimal bend angle 720 between about 25-32 degrees, at which point the Poisson Ratio of the unit cell 300 peaks.

Figure 7D:
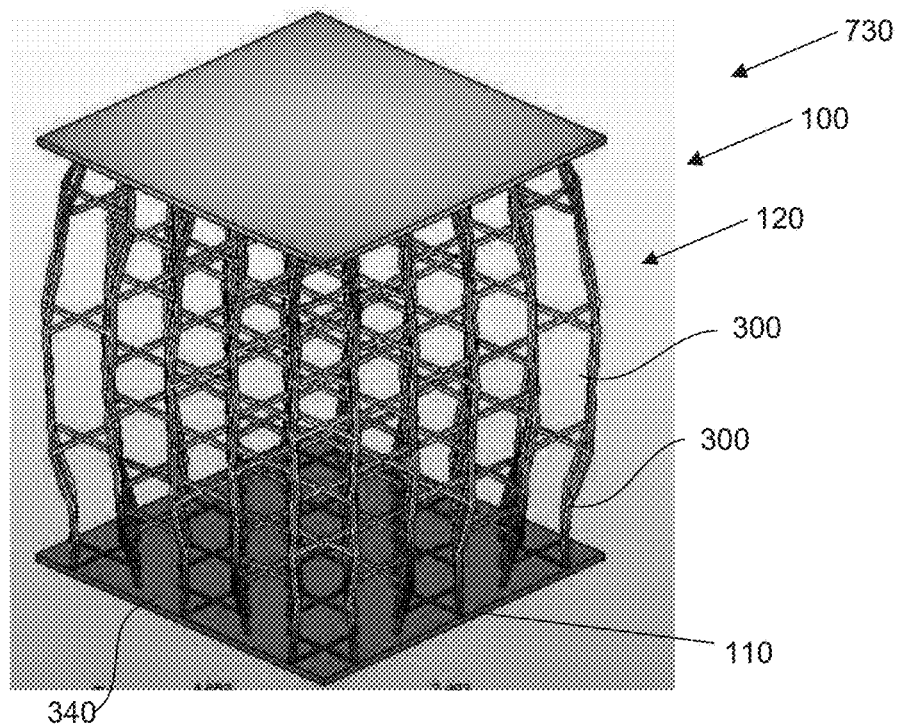
FIGS. 7D-7E respectively illustrate an example modelling of axial deformation an example first dielectric structure having a first bend angle (FIG. 7D) an example second dielectric structure having a second bend angle (FIG. 7E) responsive to an applied tensile force.
Figure 7E:
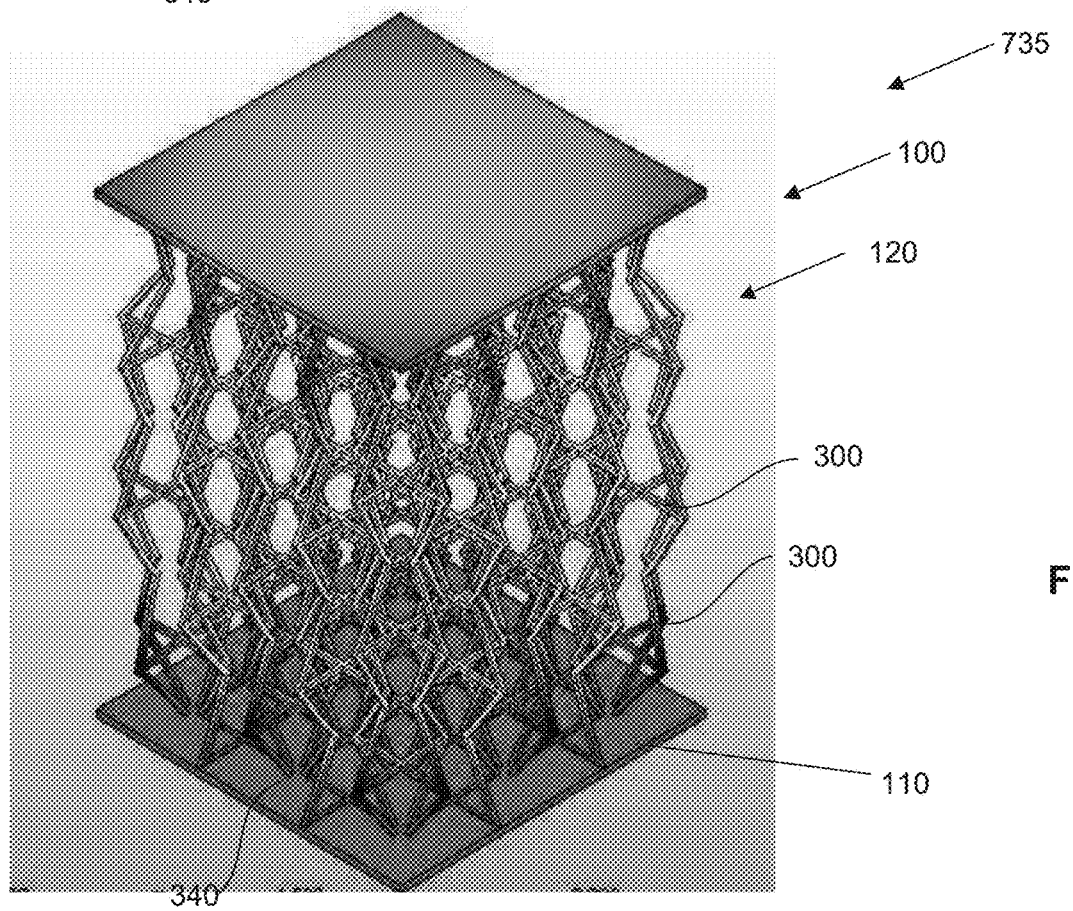

FIGS. 7D-7E respectively show an example first modelling 730 of axial deformation of an example first dielectric structure 120 having a first bend angle of 32.25° (FIG. 7D) and an example second modelling 735 of axial deformation of an example second dielectric structure 120 having a second bend angle of 14.92° (FIG. 7E) responsive to an applied tensile force. In FIGS. 7D-7E, as in FIGS. 6C-6D, base structures 340 of the unit cells 300 and the conductive substrate 130 are constrained and an axial tensile force is applied to the first conductive substrate 110, or another layer attached thereto, to impart an axial tensile force on the array of unit cells 300.

Figure 7F:
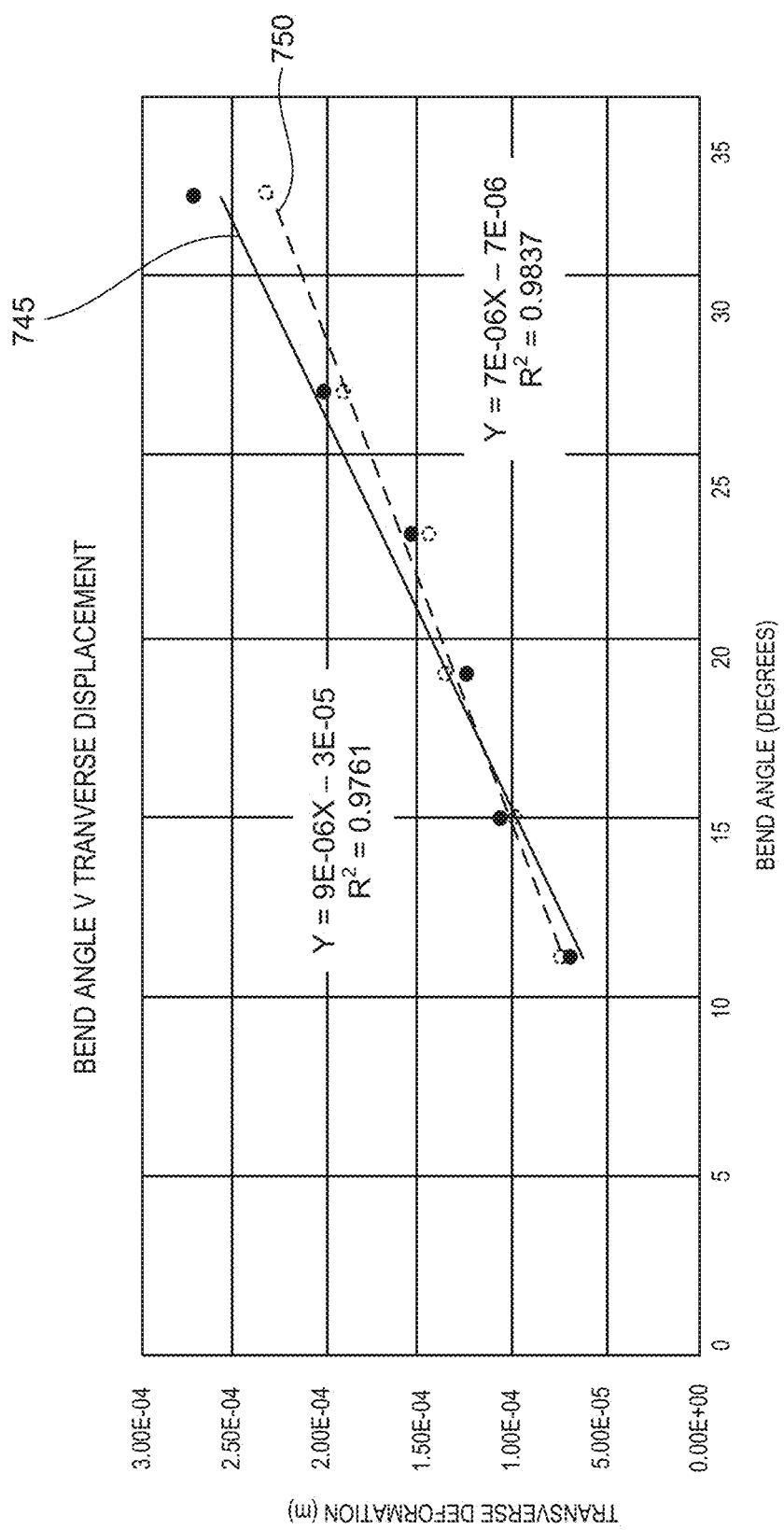
FIGS. 7F-7G illustrate, respectively, an example plot of bend angle versus transverse displacement for example dielectric structures in accordance with some teachings of this disclosure and an example plot of bend angle versus negative Poisson Ratio for example dielectric structures in accordance with some teachings of this disclosure.
Figure 7G:
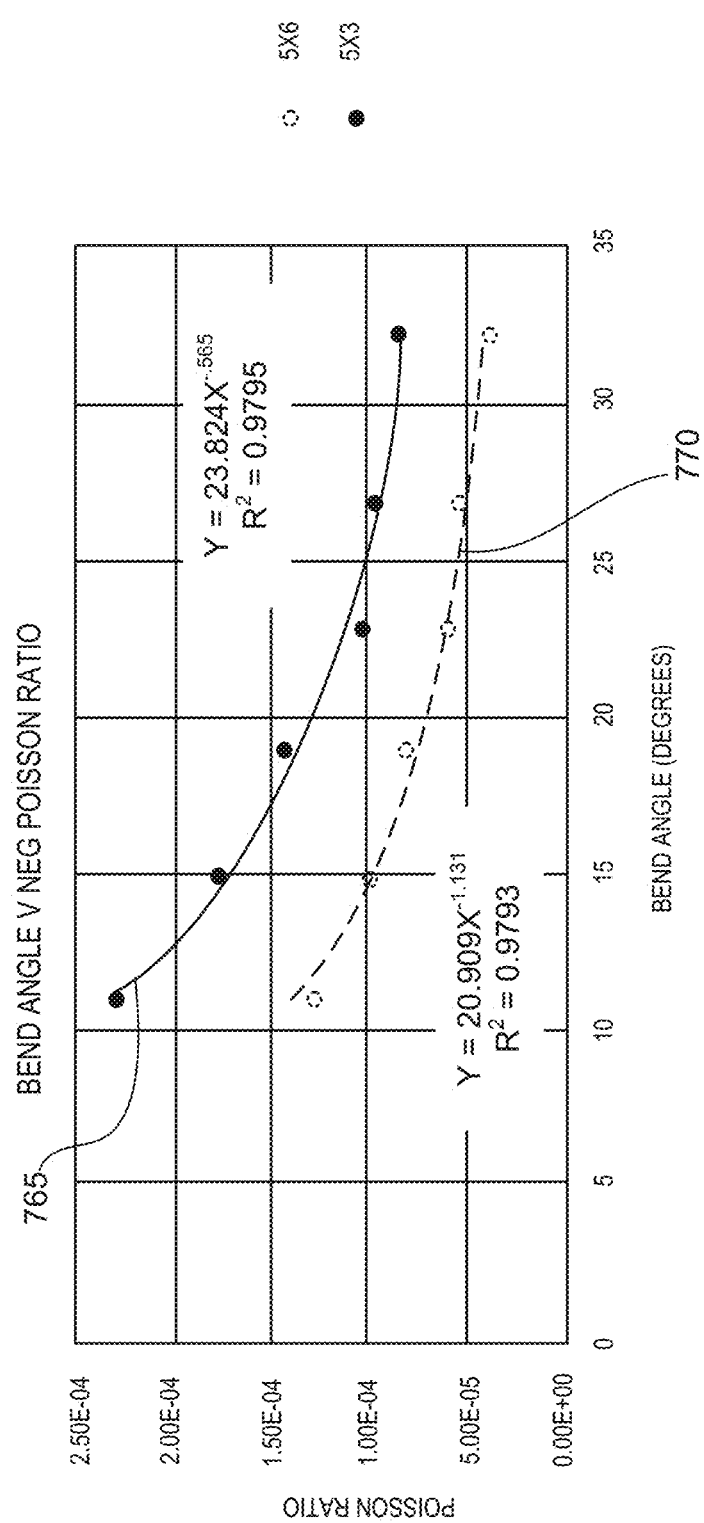

FIG. 7F shows an example plot 745 of bend angle versus transverse displacement for the example 3D-printed structure 100 of FIGS. 7D-7E. FIG. 7F also shows an example plot 750 of bend angle versus transverse displacement for an example 3D-printed structure 100 similar to that of FIGS. 7D-7E, but with a dielectric structure having a thickness twice that of the dielectric structure 120 (e.g., a height of 6 unit cells rather than 3 unit cells). FIG. 7G shows an example plot 765 of bend angle versus negative Poisson Ratio for the example 3D-printed structure 100 of FIGS. 7D-7E. FIG. 7G also illustrates an example plot 770 of bend angle versus negative Poisson Ratio for an example 3D-printed structure 100 similar to that of FIGS. 7D-7E, but with a dielectric structure having a thickness twice that of the dielectric structure 120 (e.g., a height of 6 unit cells rather than 3 unit cells).

Behavior of the 3-D structures 100 is similar to behavior of the individual unit cells 300 comprising the dielectric structure 120 of the 3-D structures 100 with respect to their axial and transverse displacement values. With increasing bend angle the transverse deformation increases slightly slower than the axial deformation. The major difference between the individual unit cells 300 and the array of unit cells 300 is that their Poisson Ratios behave differently with decreasing bend angle. For instance, an individual unit cell 300 has a peak Poisson Ratio at a bend angle of around 30°. However, an array of unit cells 300 has a Poisson Ratio that consistently rises with decreasing bend angles, as shown in FIG. 7G. Thus, while a greater transverse deformation can occur with larger bend angles, a greater transverse deformation for less axial deformation will occur with lower bend angles.

Figure 8A:
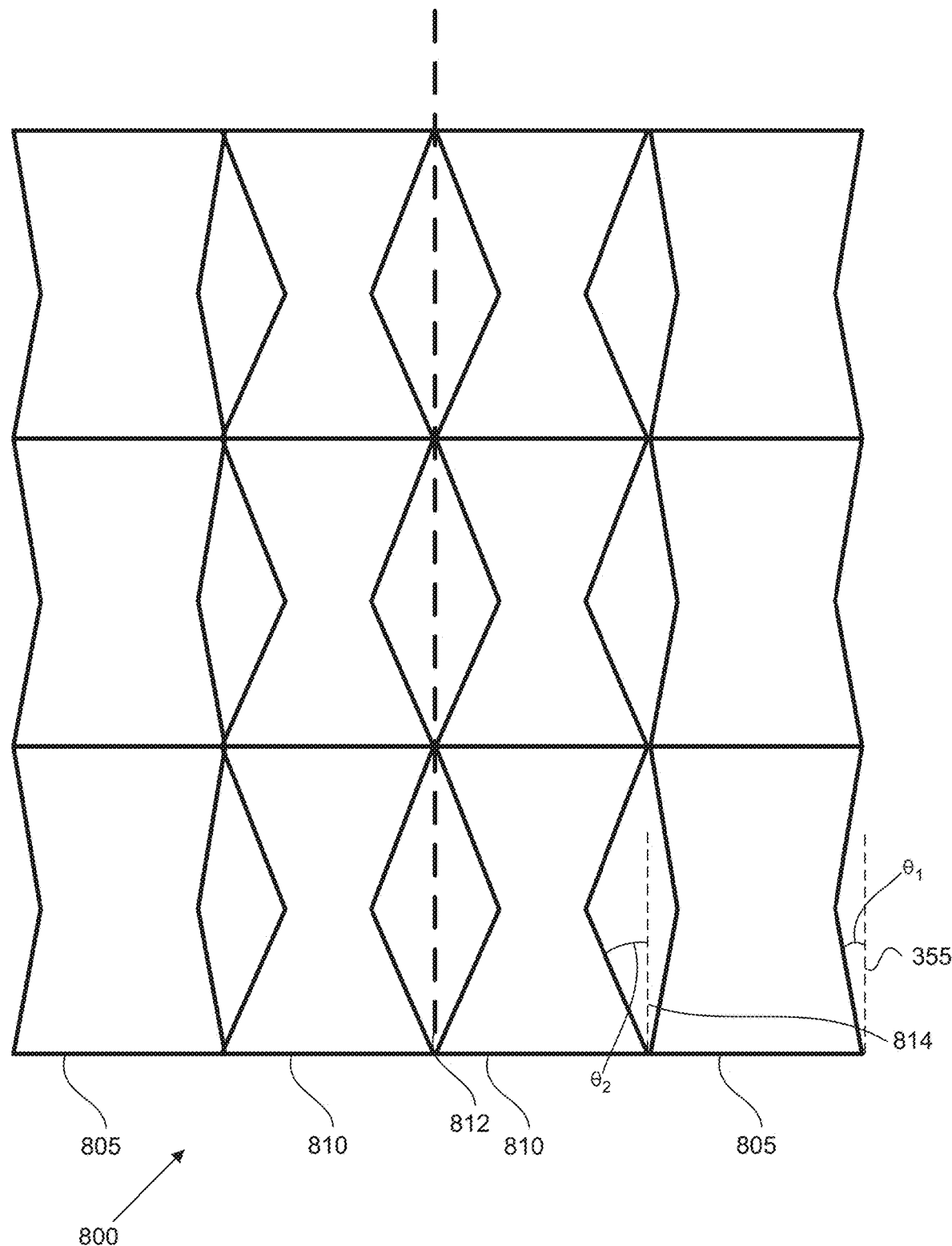
FIGS. 8A-8B are schematic illustrations of example 3D dielectric structures in accordance with some teachings of this disclosure.

FIG. 8A is a schematic illustration of an example first graded dielectric structure 800 for a 3D-printed structure 100. The first graded dielectric structure 800 was evaluated with respect to transverse deformation, bend angle and Poisson Ratio. The first graded dielectric structure 800 includes a combination of first unit cells 805 and second unit cells 810, with the first unit cells 805 further from the central axis 812 having a first bend angle 355 lower than a second bend angle 814 of the second unit cells 810 closer to the central axis 812. Stated differently, the unit cells 810 closer to the central axis 812 of the first graded dielectric structure 800 have a larger bend angle than the unit cells 810 closer to the edge of the first graded dielectric structure 800.

Figure 8B:
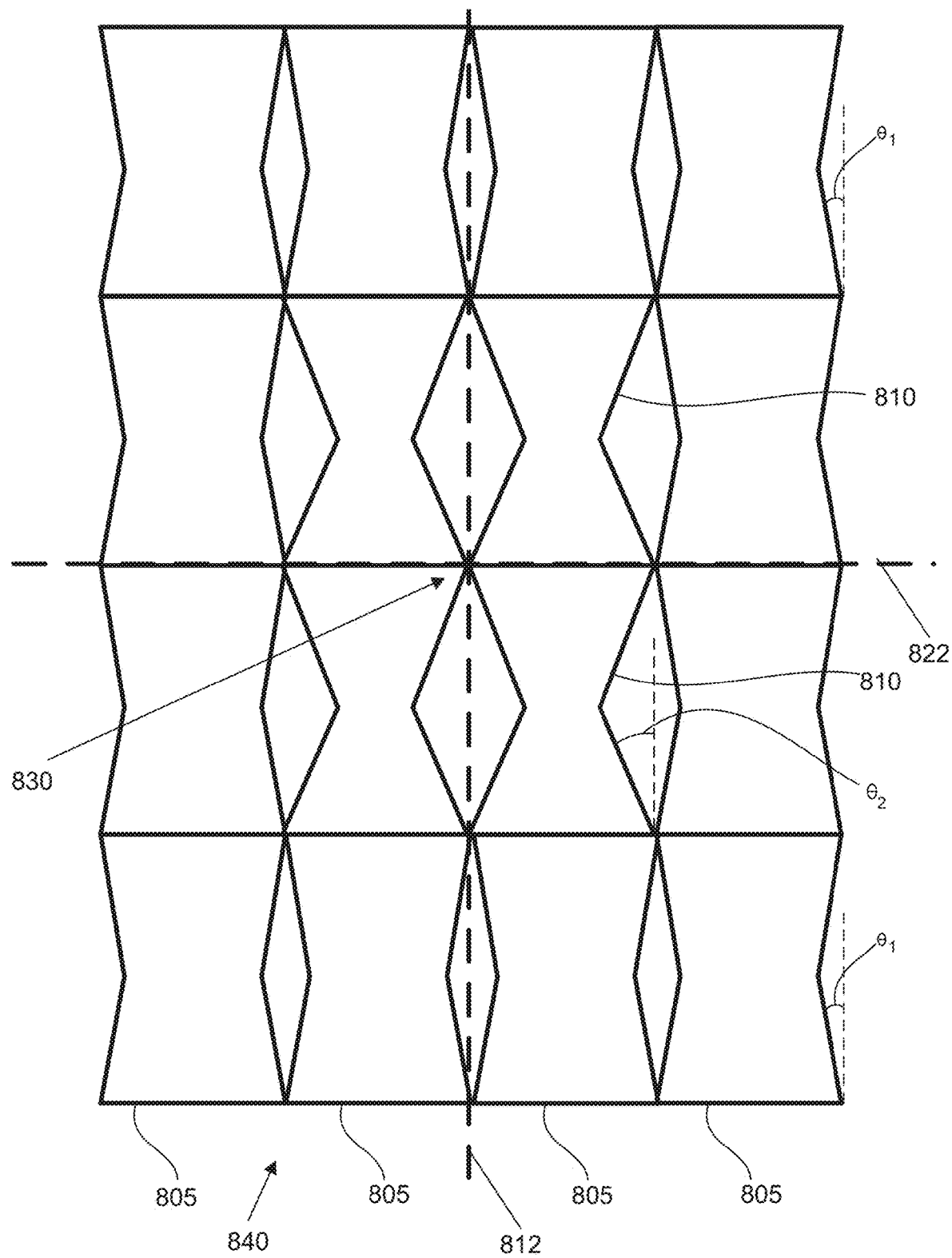

FIG. 8B is a schematic illustration of an example second graded dielectric structure 820 for a 3D-printed structure 100. The second graded dielectric structure 820 was also evaluated with respect to transverse deformation, bend angle and Poisson Ratio. The second graded dielectric structure 820 also includes a combination of first unit cells 805 and second unit cells 810, but the first unit cells 805 further from the center 830 of the second graded dielectric structure 820 have a first bend angle 355 lower than a second bend angle 814 of the second unit cells 810 closer to the center 830 of the second graded dielectric structure 820. Thus, the unit cells 810 closer to the center 830 of the second graded dielectric structure 820 have a larger bend angle than do the unit cells 805 at the corners of or periphery of the second graded dielectric structure 820.

Figure 8C:
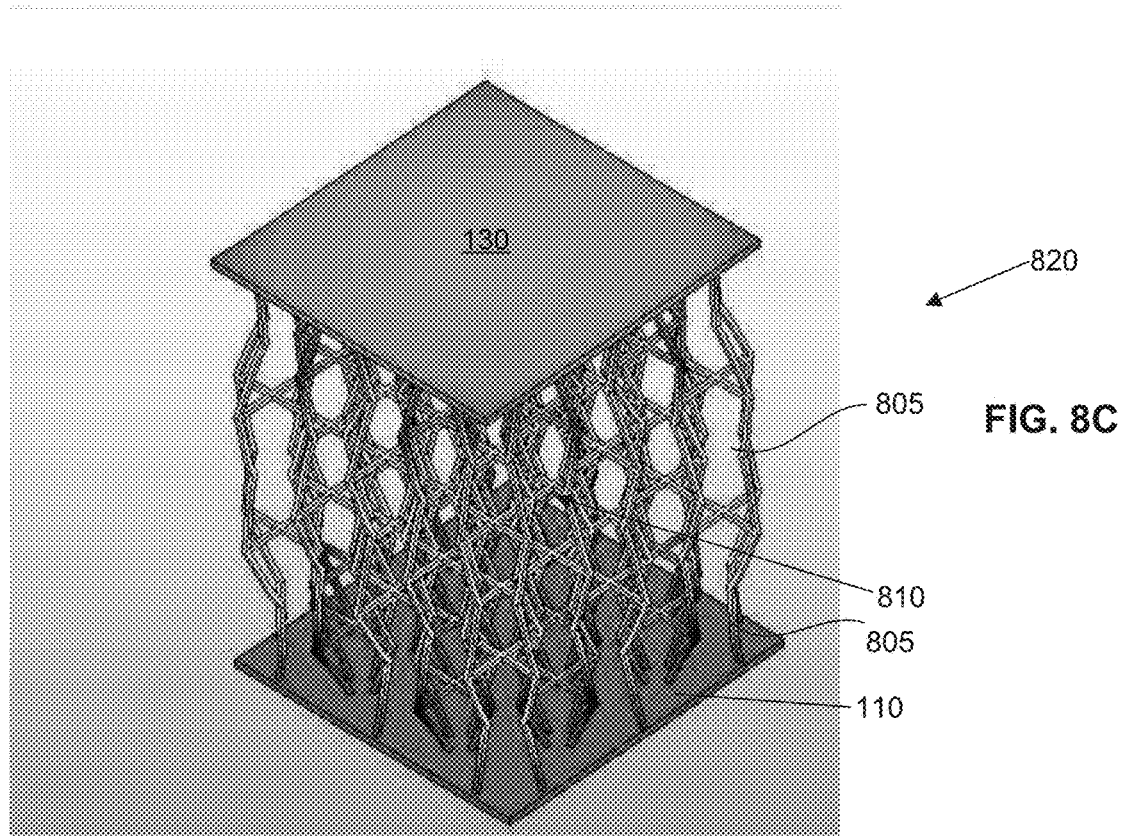
FIGS. 8C-8D respectively illustrate an example modelling of axial deformation for an example first graded dielectric structure (FIG. 8C) and for an example second graded dielectric structure (FIG. 8D) responsive to an applied tensile force.
Figure 8D:
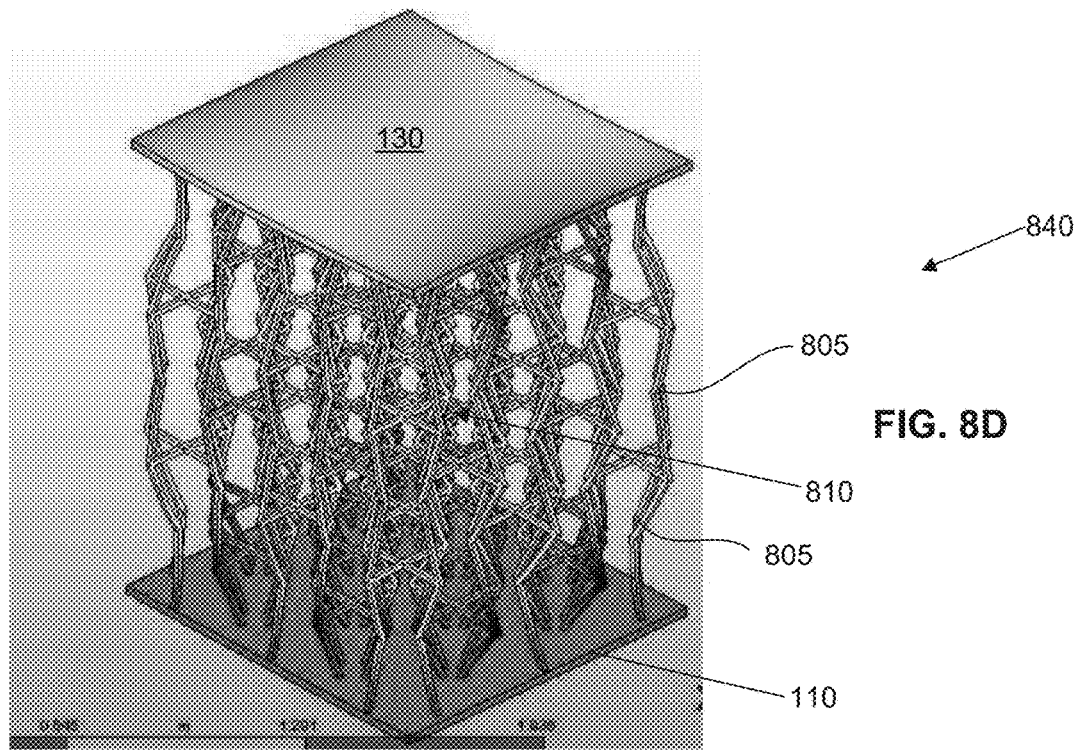

FIGS. 8C-8D respectively illustrate an example modelling of axial deformation an example first graded dielectric structure 820 (FIG. 8C) and an example second graded dielectric structure 840 (FIG. 8D) responsive to an applied tensile force.

In the first graded dielectric structure 820 of FIG. 8C, the unit cells of the first graded dielectric structure 820 include a plurality of first unit cells 805 and a plurality of second unit cells 810 arranged as in FIG. 8A with the unit cells 805 being distributed further from the center axis of the first graded dielectric structure 820 and the unit cells 810 being distributed closer to the center axis of the first graded dielectric structure 820. Thus, the bend angle of the unit cells 805, 810 varies from a low of 14.92 degrees for the unit cells 805 at a periphery of the first graded dielectric structure 820 to a high of 32.25 degrees for the unit cells 810 adjacent the center axis. Accordingly, in the example of FIG. 8C, the bend angle of the unit cells 805, 810 decreases based on a distance from the center axis of the first graded dielectric structure 820. While the example of FIGS. 8A and 8C depicts two unit cells 805, 810, the first graded dielectric structure 820 can include more than two types of unit cells. For example, the first graded dielectric structure 820 can include three or more types of unit cells. For instance, a third type of unit cells may be disposed between the unit cells 805 and the unit cells 810 and may have a bend angle between about 14.92 degrees and about 32.25 degrees.

In the second graded dielectric structure 840 of FIG. 8D, the unit cells of the second graded dielectric structure 840 include a plurality of first unit cells 805 and a plurality of second unit cells 810 arranged as in FIG. 8B with the unit cells 805 being distributed further from the center of the second graded dielectric structure 840 and the unit cells 810 being distributed closer to the center of the second graded dielectric structure 840. Thus, the bend angle of the unit cells 805, 810 varies from a low of 14.92 degrees for the unit cells 805 at a periphery of the second graded dielectric structure 840 to a high of 32.25 degrees for the unit cells 810 adjacent the center of the second graded dielectric structure 840. Accordingly, in the example of FIG. 8D, the bend angle of the unit cells 805, 810 decreases based on a distance from the center of the second graded dielectric structure 840. While the example of FIGS. 8B and 8D depicts two unit cells 805, 810, the illustrated second graded dielectric structure 840 can include more than two types of unit cells. For example, the second graded dielectric structure 840 can include three or more types of unit cells. For instance, a third type of unit cells may be disposed between the unit cells 805 and the unit cells 810 and may have a bend angle between about 14.92 degrees and about 32.25 degrees.

Figure 8E:
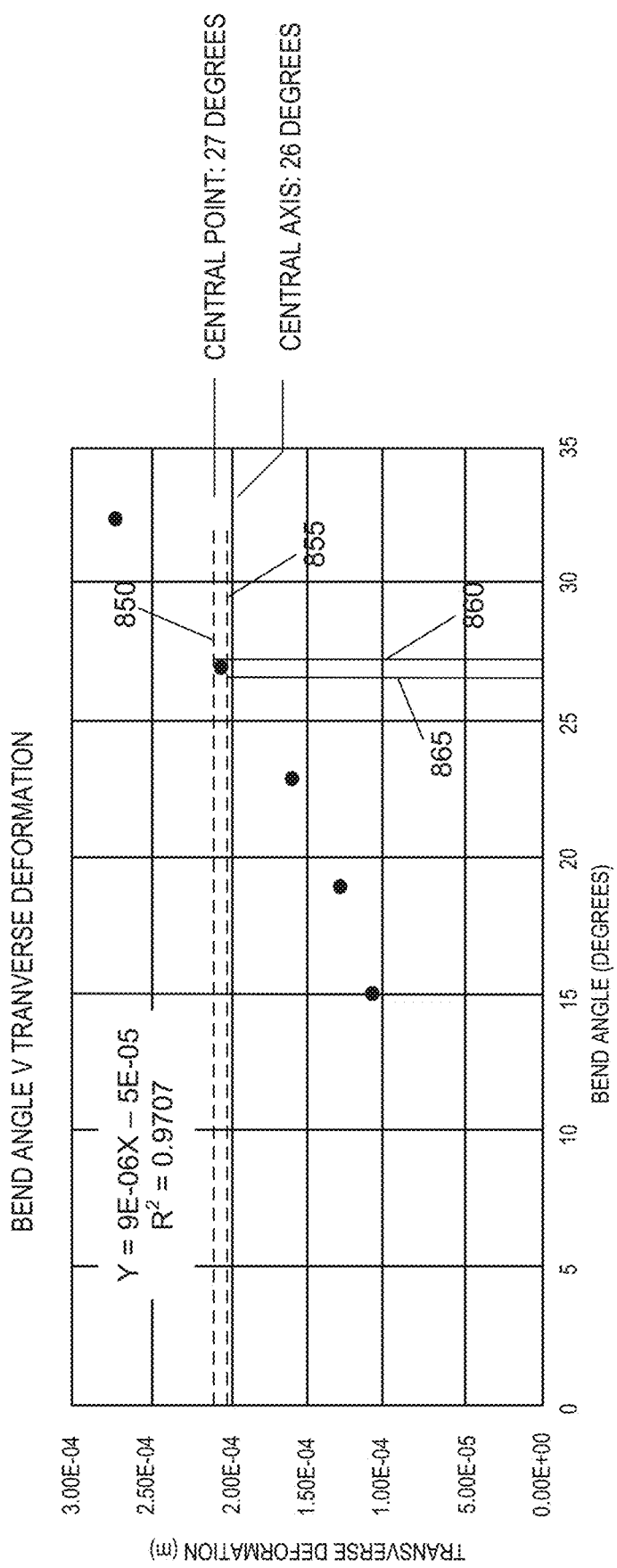
FIGS. 8E-8F illustrate, respectively, an example plot of bend angle versus transverse displacement for example dielectric structures in accordance with some teachings of this disclosure and an example plot of bend angle versus negative Poisson Ratio for example dielectric structures in accordance with some teachings of this disclosure.
Figure 8F:
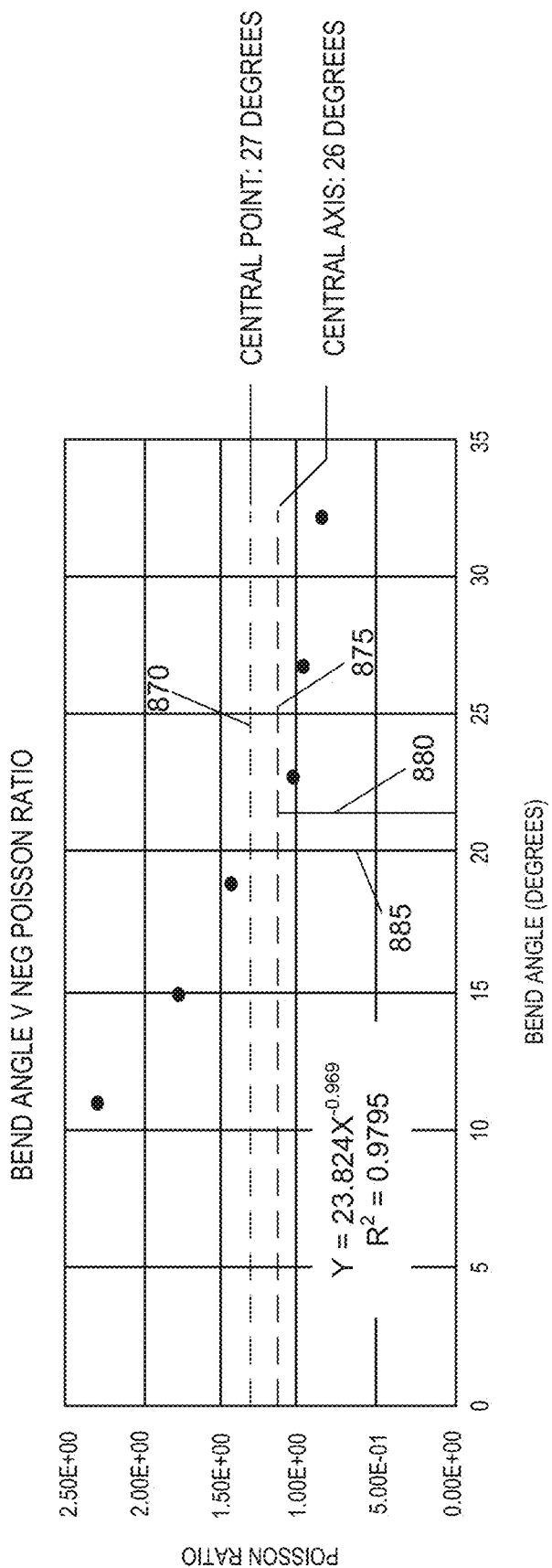

FIG. 8E is an example plot of bend angle versus transverse displacement for example dielectric structures and FIG. 8F is an example plot of bend angle versus negative Poisson Ratio for example dielectric structures. Modelling was performed to optimize a dielectric structure 820, 840 transverse deformation and Poisson ratio. In FIG. 8E, the horizontal dashed lines 850, 855 represent a performance of the second graded dielectric structure 840 and the first graded dielectric structure 820, respectively. The vertical lines 860, 865 respectively illustrate the bend angle of an equivalent homogeneous dielectric structure. In FIG. 8F, the horizontal dashed lines 870, 875 represent a performance of the second graded dielectric structure 840 and the first graded dielectric structure 820, respectively. The vertical lines 880, 885 respectively illustrate the bend angle of an equivalent homogeneous dielectric structure. By grading the dielectric structures 820, 840 as noted with respect to FIGS. 8A-8D, deformation values of a homogeneous dielectric structure with a bend angle of about 26-27 degrees and a Poisson Ratio of a homogeneous dielectric structure with a bend angle of about 20-22 degrees are realized. Stated differently, graded dielectric structures, such as the first graded dielectric structure 820 and/or the second graded dielectric structure 840, yield superior performance to a homogeneous dielectric structure. Further, the second graded dielectric structure 840 of FIG. 8D (e.g., central point structure) outperformed the first graded dielectric structure 840 of FIG. 8C (e.g., central axis structure).

Figure 9:
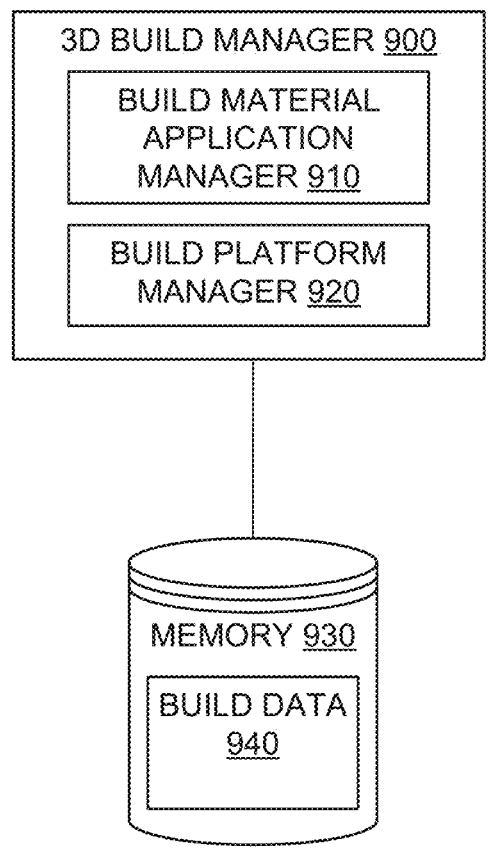
FIG. 9 is a block diagram of an example implementation of an example 3D build manager in accordance with some teachings of this disclosure.

An example manner of implementing a 3D build manager 900 is illustrated in FIG. 9. One or more of the elements, processes and/or devices illustrated in FIG. 9 may be combined, divided, re-arranged, omitted, eliminated and/or implemented in any other way. The example 3D build manager 900, the example build material application manager 910, the example build platform manager 920, the example memory 930 and/or the example build data 940 of FIG. 9 may be implemented by hardware, software, firmware and/or any combination of hardware, software and/or firmware. Thus, for example, any of the example 3D build manager 900, the example build material application manager 910, the example build platform manager 920, the example memory 930 and/or the example build data 940 of FIG. 9 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example 3D build manager 900, the example build material application manager 910, the example build platform manager 920, the example memory 930 and/or the example build data 940 of FIG. 9 is/are hereby expressly defined to include a non-transitory computer readable storage device or storage disk such as a memory, a digital versatile disk (DVD), a compact disk (CD), a Blu-ray disk, etc. including the software and/or firmware. Further still, the example 3D build manager 900 of FIG. 9 may include one or more elements, processes and/or devices in addition to, or instead of, those illustrated in FIG. 9, and/or may include more than one of any or all of the illustrated elements, processes and devices.

The example 3D build manager 900 is to control a build of the 3D printed structure 100, using a 3D printer or other additive manufacturing device, using the example build material application manager 910, the example build platform manager 920, the example memory 930 and/or the example build data 940 of FIG. 9. The build material application manager 910 is to control dispensing of one or more build materials, such as one or more of the build materials used to form the first conductive substrate 110, the dielectric structure 120 and/or the second conductive substrate 130 of the 3D printed structure, onto the build platform. The build platform manager 920 is to control a position of a 3D printer build platform relative to a build material applicator via one or more motors and/or actuators.

The memory 930 includes build data 940 which is used by the 3D build manager 900 to build the 3D printed structure 100. The build data 940 may include instructions in a 3D printing file format including all model, material and property information necessary to form the 3D printed structure 100 using a 3D printer.

Figure 10:
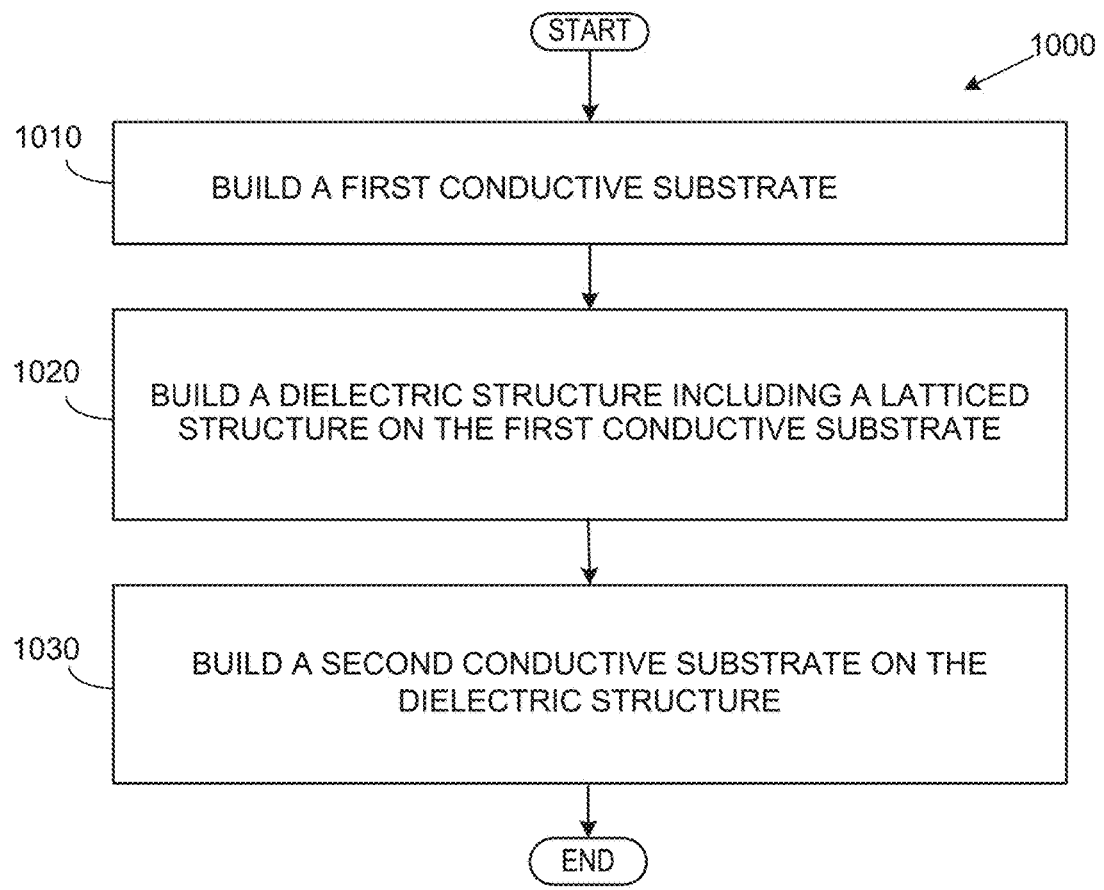
FIG. 10 presents an example flowchart representation of computer-executable instructions, which may be executed to implement the example 3D-printed structure of FIGS. 1-8 and/or the example implementation of the 3D build manager of FIG. 9.
Figure 11:
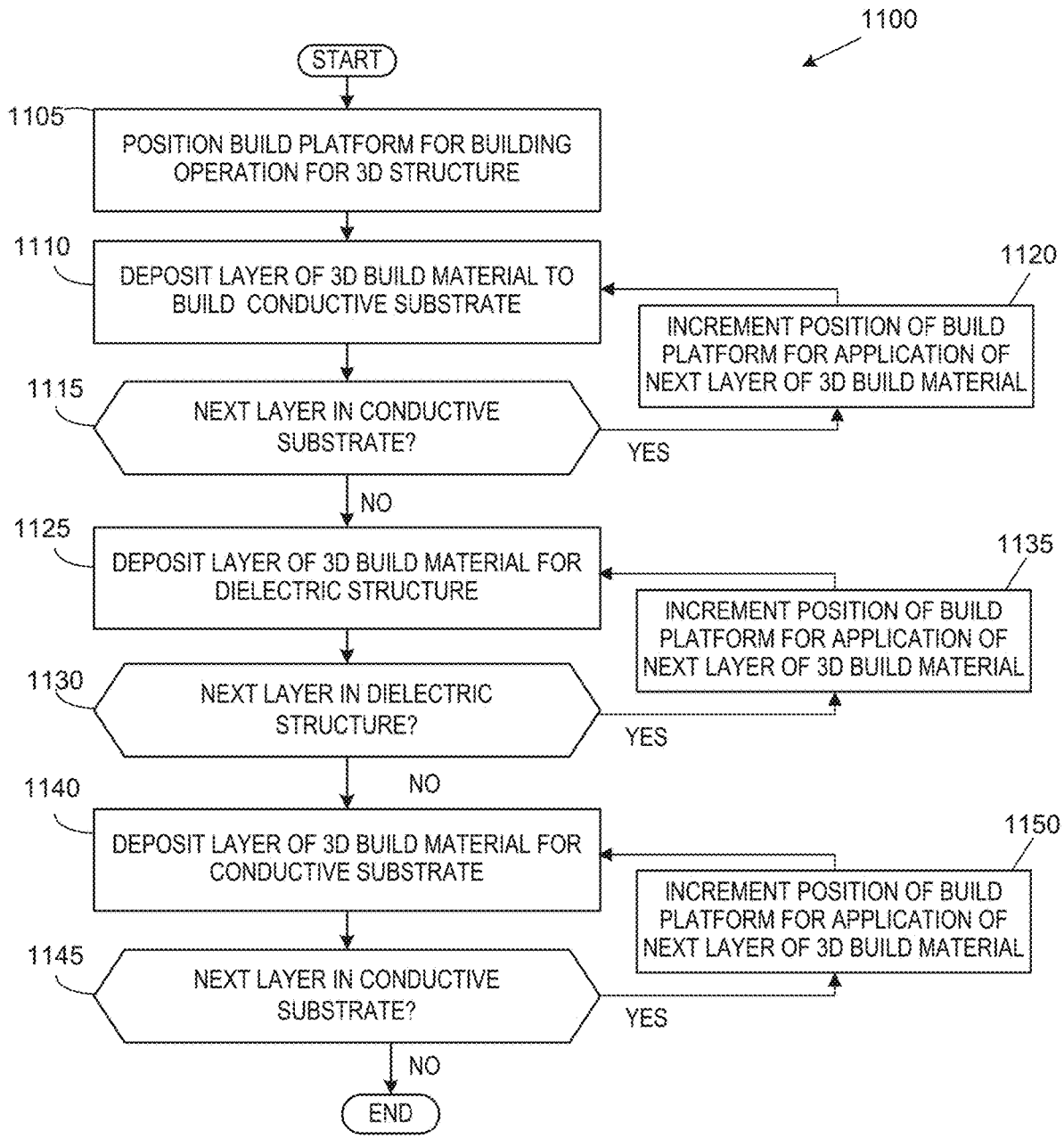
FIG. 11 presents another example flowchart representation of computer-executable instructions, which may be executed to implement the example 3D-printed structure of FIGS. 1-8 and/or the example implementation of the 3D build manager of FIG. 9.

Example flowcharts representative of example machine readable instructions for implementing the example 3D build manager 900, the example build material application manager 910, the example build platform manager 920, the example memory 930 and/or the example build data 940 of FIG. 9 are shown in FIGS. 10-11. In these examples, the machine readable instructions comprise a program for execution by a processor such as the processor 1212 shown in the example processor platform 1200 discussed below in connection with FIG. 12. The program may be embodied in software stored on a non-transitory computer readable storage medium such as a CD-ROM, a floppy disk, a hard drive, a digital versatile disk (DVD), a Blu-ray disk, or a memory associated with the processor 1212, but the entire program and/or parts thereof could alternatively be executed by a device other than the processor 1212 and/or embodied in firmware or dedicated hardware. Further, although the example program is described with reference to the flowcharts illustrated in FIG. 10, many other methods of implementing the example 3D build manager 900, the example build material application manager 910, the example build platform manager 920, the example memory 930 and/or the example build data 940 of FIG. 9 to make the 3D-printed structures 100 of FIGS. 1-8D may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example programs of FIGS. 10-11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

The example program 1000 of FIG. 10 begins at block 1005 by building a first conductive substrate 110 via a 3D printer or other additive manufacturing device and the example 3D build manager 900, the example build material application manager 910, the example build platform manager 920, the example memory 930 and/or the example build data 940 of FIG. 9. As shown by way of example in FIG. 2D, the building of the first conductive substrate 110 can include sequentially building a plurality of layers 210, layer-by-layer, to form the first conductive substrate 110.

The example program 1000 of FIG. 10 then proceeds to block 1110 and the building of a dielectric structure 120 including a latticed structure, such as is represented by way of example in FIGS. 3A-4C, on the first conductive substrate 110 via a 3D printer or other additive manufacturing device, the example 3D build manager 900, the example build material application manager 910, the example build platform manager 920, the example memory 930 and/or the example build data 940 of FIG. 9. As shown by way of example in FIG. 2D, the building of the dielectric structure 120 can include sequentially building a plurality of layers 210, layer-by-layer, to form the dielectric structure 120.

The example program 1000 of FIG. 10 then proceeds to block 1030 and the building of a second conductive substrate 130 on the dielectric substrate 120, such as is represented by way of example in FIG. 2D, via the 3D printer or other additive manufacturing device, the example 3D build manager 900, the example build material application manager 910, the example build platform manager 920, the example memory 930 and/or the example build data 940 of FIG. 9. As shown by way of example in FIG. 2D, the building of the second conductive substrate 130 can include sequentially building a plurality of layers 210, layer-by-layer, to form the second conductive substrate 130.

The example program 1100 of FIG. 11 begins at block 1105 by positioning a build platform of the 3D printer or other additive manufacturing device, via the example 3D build manager 900 and/or the example build platform manager 920, for initiation of a building operation for the example 3D-printed structure 100. Control then passes to block 1110.

At block 1110, the example 3D build manager 900 and/or the example build material application manager 910 deposit a layer of a 3D build material (e.g., a conductive material) to build the first conductive substrate 110. Control then passes to block 1115, where the example 3D build manager 900 determines, using the example memory 930 and/or the example build data 940, whether a next layer of the 3D build material is to be applied to build the first conductive substrate 110. If the outcome of block 1115 is in the affirmative (block 1115="YES"), then the example 3D build manager 900 and/or the example build platform manager 920 increment a position of the build platform for application of a next layer of the 3D build material for the first conductive substrate 110 in block 1120 and control passes back to block 1110. The process of depositing a layer of 3D build material to build the first conductive substrate 110, determination as to whether an additional layer of build material is to be applied to build the first conductive substrate 110, and incrementing of a position of the build platform for application of a next layer of the 3D build material for the first conductive substrate 110 continues until the outcome of block 1115 is negative (block 1115="NO"), at which point control passes to block 1125. At block 1125, the example 3D build manager 900, the example build material application manager 910, the example build platform manager 920, the example memory 930 and/or the example build data 940 deposit a layer of a 3D build material (e.g., a dielectric material) for the example dielectric structure 120.

Control then passes to block 1130 and the example 3D build manager 900 determines, using the example memory 930 and/or the example build data 940, if a next layer of the 3D build material for the dielectric structure 120 is to be deposited to build the dielectric structure 120. If the outcome of block 1130 is in the affirmative (block 1130="YES"), then the example 3D build manager 900 and/or the example build platform manager 920 increment a position of the build platform for application of a next layer of the 3D build material for the dielectric structure 120 in block 1135 and control passes back to block 1125. This process of depositing a layer of 3D build material for the dielectric structure 120 to build the dielectric structure 120 (block 1125), determination as to whether additional layers of build material are required to be applied to build the dielectric structure 120 (block 1130), and incrementing of a position of the build platform for application of a next layer of the 3D build material for the dielectric structure 120 (block 1135) continues until the outcome of block 1130 is negative (block 1130="NO").

At block 1140, the example 3D build manager 900 and/or the example build material application manager 910 deposit a layer of a 3D build material (e.g., a conductive material) to build the second conductive substrate 130. Control then passes to block 1145, where the example 3D build manager 900 determines, using the example memory 930 and/or the example build data 940, whether a next layer of the 3D build material is to be applied to build the second conductive substrate 130. If the outcome of block 1145 is in the affirmative (block 1145="YES"), then the example 3D build manager 900 and/or the example build platform manager 920 increment a position of the build platform for application of a next layer of the 3D build material for the second conductive substrate 130 in block 1150 and control passes back to block 1110. The process of depositing a layer of 3D build material to build the second conductive substrate 130 (block 1140), determination as to whether an additional layer of build material is to be applied to build the second conductive substrate 130 (block 1145), and incrementing of a position of the build platform for application of a next layer of the 3D build material for the second conductive substrate 130 (block 1150) continues until the outcome of block 1145 is negative (block 1145="NO"), at which point the 3D-printed product 100 is completed and the process of building the 3D-printed product 100 ends.

Figure 12:
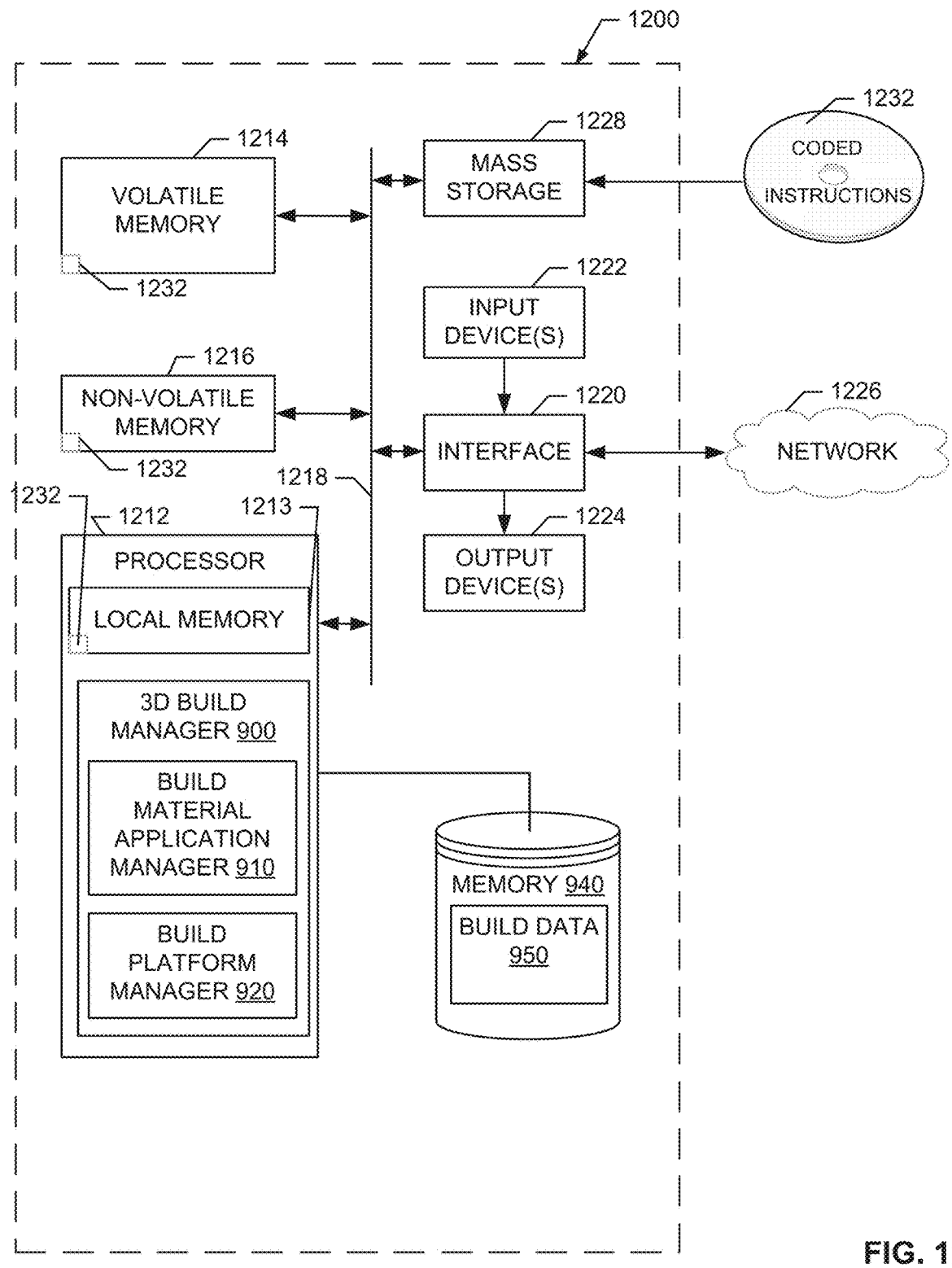
FIG. 12 is a block diagram illustrating an example processor platform which may execute the instructions of FIGS. 10-11 to implement the example 3D-printed structure of FIGS. 1-8 and/or the example implementation of the 3D build manager of FIG. 9.

FIG. 12 is a block diagram of an example processor platform 1200 capable of executing the instructions of FIGS. 10-11 to implement the example 3D build manager 900 of FIG. 9 to produce the example 3D-printed products 100 of FIGS. 1-8F. The processor platform 1200 can be, for example, a server, a personal computer, a mobile device (e.g., a cell phone, a smart phone, a tablet such as an iPad™), a personal digital assistant (PDA), an Internet appliance, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors or controllers from any desired family or manufacturer. The hardware processor may be a semiconductor based (e.g., silicon based) device. In this example, the processor implements the example 3D build manager 900, the example build material application manager 910, the example build platform manager 920, the example memory 930 and/or the example build data 940 of FIG. 9.

The processor 1212 of the illustrated example includes a local memory 1213 (e.g., a cache). The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), and/or a PCI express interface.

In the illustrated example, one or more input devices 1222 are connected to the interface circuit 1220. The input device(s) 1222 permit(s) a user to enter data and/or commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1224 are also connected to the interface circuit 1220 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1220 of the illustrated example, thus, typically includes a graphics driver card, a graphics driver chip and/or a graphics driver processor.

The interface circuit 1220 of the illustrated example also includes a communication device such as a transmitter, a receiver, a transceiver, a modem and/or network interface card to facilitate exchange of data with external machines (e.g., computing devices of any kind) via a network 1226 (e.g., an Ethernet connection, a digital subscriber line (DSL), a telephone line, coaxial cable, a cellular telephone system, etc.).

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, RAID systems, and digital versatile disk (DVD) drives.

The coded instructions 1232 of FIGS. 10-11 may be stored in the mass storage device 1228, in the volatile memory 1214, in the non-volatile memory 1216, and/or on a removable tangible computer readable storage medium such as a CD or DVD.

From the foregoing, it will be appreciated that example methods, apparatus and articles of manufacture have been disclosed that yield an example 3D-printed structure 100 having an example dielectric structure 120 (e.g., an auxetic structure, a lattice structure, etc.) functioning as an energy absorbing material and functioning to deliver, in combination with the example first conductive substrate 110 and the example second conductive substrate 130, information relative to, for example, a locus and an intensity of an impact. These example 3D-printed structures 100 can be purposed as a compression sensor, a bend sensor and/or a tensile sensor. In some examples, a product (e.g., a garment, footwear, protective equipment, shock absorbing device, orthotic device, prosthetic device, shipping material, packing material, padding, etc.) can include any combination of one or more types of the example 3D-printed structures 100 (e.g., one or more compression sensors, one or more bend sensors and/or one or more tensile sensors).

Example 1 is a 3D-printed structure including a first conductive substrate, a second conductive substrate and a dielectric structure between the first conductive substrate and the second conductive substrate, the dielectric structure including a latticed structure having a first stiffness in a first direction and a second stiffness in a second direction different than the first direction.

Example 2 includes the 3D-printed structure of example 1, wherein the latticed structure includes a plurality of first unit cells having a first structure.

Example 3 includes the 3D-printed structure as defined in any of Examples 1-2, wherein the latticed structure includes a plurality of second unit cells having a second structure different than the first structure.

Example 4 includes the 3D-printed structure as defined in any of Examples 1-3, wherein at least one of the first structure or the second structure is an auxetic structure having a negative Poisson ratio.

Example 5 includes the 3D-printed structure as defined in any of Examples 1-4, wherein the first structure and the second structure are auxetic structures, each having a negative Poisson ratio.

Example 6 includes the 3D-printed structure as defined in any of Examples 1-5, wherein at least one of the first conductive substrate, the second conductive substrate or the dielectric structure include an infill density between approximately 10%-80%.

Example 7 includes the 3D-printed structure as defined in any of Examples 1-6, wherein the first structure and the second structure each include a lower portion, a middle portion and an upper portion, the first and second structures defining respective hourglass shapes with lateral dimensions of the middle portion being smaller than lateral dimensions of the lower portion and the upper portion.

Example 8 includes the 3D-printed structure as defined in any of Examples 1-7, wherein the first structure includes a base structure, a top structure, and a plurality of legs extending between the base structure and the top structure, the plurality of legs extending inwardly by a first bend angle from a vertical toward a middle portion between the base structure and the top structure.

Example 9 includes the 3D-printed structure as defined in any of Examples 1-8, wherein the second structure includes a base structure, a top structure, and a plurality of legs extending between the base structure and the top structure, the plurality of legs extending inwardly by a second bend angle from a vertical toward a middle portion between the base structure and the top structure.

Example 10 includes the 3D-printed structure as defined in any of Examples 1-9, wherein the first bend angle is between approximately 10°-35° and wherein the second bend angle is between approximately 10°-35°, with the second bend angle being different than the first bend angle.

Example 11 includes the 3D-printed structure as defined in any of Examples 1-10, wherein a thickness of the dielectric structure is between approximately 0.1 mm-1.5 mm.

Example 12 includes the 3D-printed structure as defined in any of Examples 1-11, wherein a layer height to build at least one of the first conductive substrate, the second conductive substrate, or the dielectric structure is between approximately 0.06 mm-0.10 mm.

Example 13 includes the 3D-printed structure as defined in any of Examples 1-12, wherein at least one of the first conductive substrate or the second conductive substrate includes carbon nanotube filaments, graphene, graphide, nano metallization or silver nano wire.

Example 14 includes the 3D-printed structure as defined in any of Examples 1-13, wherein the dielectric structure includes an elastomeric polyurethane (EPU), a thermoplastic polyurethane (TPU), and/or a thermoplastic elastomer (TPE).

Example 15 includes the 3D-printed structure as defined in any of Examples 1-14, further including a first electrical connector built in the first conductive substrate and a second electrical connector built in the second conductive substrate.

Example 16 includes the 3D-printed structure as defined in any of Examples 1-15, wherein the first direction is normal to at least one of the first conductive substrate or the second conductive substrate.

Example 17 includes the 3D-printed structure as defined in any of Examples 1-16, wherein the first conductive substrate has a first infill density and the second conductive substrate has a second infill density different than the first infill density.

Example 18 is a sensor circuit including a sensor having a first conductive substrate having a first electrical connector, a second conductive substrate having a second electrical connector, and a dielectric structure between the first conductive substrate and the second conductive substrate, the dielectric structure including a latticed structure having a first stiffness in a first direction and a second stiffness in a second direction different than the first direction, and a processor, operatively connected to the sensor via the first electrical connector and the second electrical connector, to determine for a first strain of the dielectric structure along the first direction, at least one of a location of the first strain, a magnitude of the first strain, a first strain rate, or a first strain rate acceleration.

Example 19 includes the sensor circuit as defined in Example 18, wherein the sensor includes at least one of a compression sensor, a flex sensor, or a stretch-strain sensor.

Example 20 includes the sensor circuit as defined in any of Examples 18-19, wherein at least one of the first conductive substrate, the second conductive substrate or the dielectric structure include an infill density between approximately 10%-80%.

Example 21 includes the sensor circuit as defined in any of Examples 18-20, wherein at least one of the first conductive substrate, the second conductive substrate or the dielectric structure include an infill density between approximately 10%-80%.

Example 22 includes the sensor circuit as defined in any of Examples 18-21, wherein the latticed structure includes a plurality of second unit cells having a second structure different than the first structure.

Example 23 includes the sensor circuit as defined in any of Examples 18-22, wherein at least one of the first structure or the second structure is an auxetic structure having a negative Poisson ratio.

Example 24 includes the sensor circuit as defined in any of Examples 18-23, wherein the negative Poisson ratio is between approximately 0.0 to approximately 0.50.

Example 25 includes the sensor circuit as defined in any of Examples 18-24, wherein the first structure and the second structure include a respective lower portion, a respective middle portion and a respective upper portion to define an hourglass shape with lateral dimensions of the respective middle portion being smaller than lateral dimensions of the respective lower portion and the respective upper portion.

Example 26 includes the sensor circuit as defined in any of Examples 18-25, wherein the first structure includes a base structure, a top structure, and a plurality of legs extending between the base structure and the top structure, the plurality of legs extending inwardly by a first bend angle from a vertical toward a middle portion between the base structure and the top structure.

Example 27 includes the sensor circuit as defined in any of Examples 18-26, wherein the second structure includes a base structure, a top structure, and a plurality of legs extending between the base structure and the top structure, the plurality of legs extending inwardly by a second bend angle from a vertical toward a middle portion between the base structure and the top structure.

Example 28 includes the sensor circuit as defined in any of Examples 18-27, wherein the first bend angle is between approximately 10°-35° and wherein the second bend angle is between approximately 10°-35°, with the second bend angle being different than the first bend angle.

Example 29 includes the sensor circuit as defined in any of Examples 18-28, wherein a thickness of the dielectric structure is between approximately 0.1 mm-1.5 mm.

Example 30 includes the sensor circuit as defined in any of Examples 18-29, wherein a layer height to build at least one of the first conductive substrate, the second conductive substrate, or the dielectric structure is between approximately 0.06 mm-0.10 mm.

Example 31 includes the sensor circuit as defined in any of Examples 18-30, wherein at least one of the first conductive substrate or the second conductive substrate includes carbon nanotube (CNT) filaments including approximately 10% CNT, graphene, graphide, nano metallization or silver nano wire.

Example 32 includes the sensor circuit as defined in any of Examples 18-31, wherein the dielectric structure includes an elastomeric polyurethane (EPU), a thermoplastic polyurethane (TPU), and/or a thermoplastic elastomer (TPE).

Example 33 includes the sensor circuit as defined in any of Examples 18-32, wherein, for a second strain of the dielectric structure along the second direction, the processor is to determine at least one of a location of the second strain, a magnitude of the second strain, a second strain rate, or a second strain rate acceleration.

Example 34 includes the sensor circuit as defined in any of Examples 18-33, wherein the first conductive substrate has a first infill density and the second conductive substrate has a second infill density different than the first infill density.

Example 35 is a wearable device including a securement means to secure the wearable device to a wearer and a sensor means to sense forces applied to the wearable device, the sensor means including a first conductive substrate having a first electrical connector, a second conductive substrate having a second electrical connector, and a dielectric structure between the first conductive substrate and the second conductive substrate, the dielectric structure including a latticed structure having a first stiffness in a first direction and a second stiffness in a second direction different than the first direction, the sensor means being configured to output at least one of a first strain of the dielectric structure along the first direction, a location of the first strain, a magnitude of the first strain, a first strain rate, or a first strain rate acceleration.

Example 36 includes the wearable device as defined in Example 35, further including a processor, operatively connected to the sensor means, via the first electrical connector and the second electrical connector, wherein the wearable device includes an orthotic device, a brace, footwear, sports equipment, or a helmet.

Example 37 is a method of building a sensor with a 3D printer including building a first conductive substrate, building a dielectric structure including a latticed structure on the first conductive substrate, and building a second conductive substrate on the dielectric structure.

Example 38 includes the method of building the sensor as defined in Example 37, wherein the latticed structure includes a plurality of first unit cells having a first structure.

Example 39 includes the method of building the sensor as defined in any of Examples 37-38, wherein the first structure includes a first lower portion, a first middle portion and a first upper portion, defining a first hourglass shape with lateral dimensions of the first middle portion smaller than lateral dimensions of the first lower portion and the first upper portion.

Example 40 includes the method of building the sensor as defined in any of Examples 37-39, wherein the first structure includes a first base structure, a first top structure, and a plurality of first legs extending between the first base structure and the first top structure, the plurality of first legs extending inwardly by a first bend angle from a vertical toward a first middle portion between the first base structure and the first top structure.

Example 41 includes the method of building the sensor as defined in any of Examples 37-40, wherein the latticed structure includes a plurality of second unit cells having a second structure different than the first structure.

Example 42 includes the method of building the sensor as defined in any of Examples 37-41, wherein the second structure includes a second lower portion, a second middle portion and a second upper portion, defining a second hourglass shape with lateral dimensions of the second middle portion smaller than lateral dimensions of the second lower portion and the second upper portion.

Example 43 includes the method of building the sensor as defined in any of Examples 37-42, wherein the second structure includes a second base structure, a second top structure, and a plurality of second legs extending between the second base structure and the second top structure, the plurality of second legs extending inwardly by a second bend angle from a vertical toward a second middle portion between the second base structure and the second top structure.

Example 44 includes the method of building the sensor as defined in any of Examples 37-43, wherein the first bend angle is between approximately 10°-35° and wherein the second bend angle is between approximately 10°-35°, with the second bend angle being different than the first bend angle.

Example 45 includes the method of building the sensor as defined in any of Examples 37-44, wherein at least one of the first structure or the second structure is an auxetic structure having a negative Poisson ratio.

Example 46 includes the method of building the sensor as defined in any of Examples 37-45, wherein the negative Poisson ratio is between approximately 0.0 to approximately 0.50.

Example 47 includes the method of building the sensor as defined in any of Examples 37-46, wherein the building of the dielectric structure includes building the dielectric structure to a thickness between approximately 0.1 mm-1.5 mm.

Example 48 includes the method of building the sensor as defined in any of Examples 37-47, wherein the building of at least one of the first conductive substrate, the second conductive substrate, or the dielectric structure includes building a plurality of layers having a height between approximately 0.06 mm-0.10 mm.

Example 49 includes the method of building the sensor as defined in any of Examples 37-48, further including building a first electrical connector in the first conductive substrate and building a second electrical connector in the second conductive substrate.

Example 50 includes the method of building the sensor as defined in any of Examples 37-49, further including using a nozzle having a diameter of between approximately 0.8 mm-1.0 mm to deposit one or more layers of at least one of the first conductive substrate, the dielectric structure or the second conductive substrate.

Example 51 includes the method of building the sensor as defined in any of Examples 37-50, wherein at least one of the first conductive substrate, the second conductive substrate or the dielectric structure include an infill density between approximately 10%-80%.

Example 52 is a 3D-printed structure including a first conductive means, a second conductive means and a dielectric means between the first conductive means and the second conductive means, the dielectric means including a latticed structure having a plurality of auxetic cells.

Example 53 includes the 3D-printed structure as defined in Example 52, wherein the latticed structure includes a plurality of first auxetic cells having a first structure and a plurality of second auxetic cells having a second structure different than the first structure.

Example 54 includes the method of building the sensor as defined in any of Examples 52-53, wherein the dielectric means has a first stiffness in a first direction and has a second stiffness in a second direction different than the first direction, and wherein at least one of the first conductive means, the second conductive means or the dielectric means includes an infill density between approximately 10%-80%.

Example 55 is a non-transitory machine readable medium comprising executable instructions that, when executed, cause at least one processor to at least build a first conductive substrate, build a dielectric structure including a latticed structure having a plurality of auxetic cells on the first conductive substrate and build a second conductive substrate on the dielectric structure.

Example 56 includes the non-transitory machine readable medium as defined in Example 55, further including executable instructions that, when executed, cause the at least one processor to build at least one of the first conductive substrate, the second conductive substrate or the dielectric structure with an infill density between approximately 10%-80%.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method of building a sensor with a 3D printer, the method comprising:
   building a first conductive substrate;
   building a second conductive substrate; and
   building a dielectric structure between the first conductive substrate and the second conductive substrate, the dielectric structure including:
   a first latticed structure including a first plurality of legs extending inwardly at a first angle, the first latticed structure having a first stiffness in a first direction and a second stiffness in a second direction different than the first direction, the second stiffness different than the first stiffness; and
   a second latticed structure including a second plurality of legs extending inwardly at a second angle, the second angle different than the first angle, the second latticed structure having a third stiffness in a third direction and a fourth stiffness in a fourth direction different than the third direction, the fourth stiffness different than the third stiffness.

2. The method of building the sensor of claim 1, wherein the building of the dielectric structure includes building first unit cells having a first structure to form the first latticed structure and building second unit cells having a second structure to form the second latticed structure.

3. The method of building the sensor of claim 2, wherein the second structure is different from the first structure.

4. The method of building the sensor of claim 1, wherein the building of the first latticed structure includes building a lower portion, a middle portion, and an upper portion, lateral dimensions of the middle portion smaller than lateral dimensions of the lower portion, and the lateral dimensions of the middle portion smaller than lateral dimensions of the upper portion.

5. The method of building the sensor of claim 4, wherein the lower portion is a first lower portion, the middle portion is a first middle portion, and the upper portion is a first upper portion, the building of the second latticed structure including building a second lower portion, a second middle portion, and a second upper portion, lateral dimensions of the second middle portion smaller than lateral dimensions of the second lower portion, and the lateral dimensions of the second middle portion smaller than lateral dimensions of the second upper portion.

6. The method of building the sensor of claim 1, wherein the building of the first latticed structure includes building a base structure and a top structure,
   the first plurality of legs extending between the base structure and the top structure, and
   the first plurality of legs extending inwardly by the first angle from a vertical toward a center portion between the base structure and the top structure.

7. The method of building the sensor of claim 6, wherein the base structure is a first base structure, the top structure is a first top structure, the center portion is a first center portion, and the building of the second latticed structure includes building a second base structure and a second top structure,
   the plurality of second legs between the second base structure and the second top structure, and
   the plurality of second legs extending inwardly by the second angle from a vertical toward a second center portion between the second base structure and the second top structure.

8. The method of building the sensor of claim 7, wherein the first angle is between approximately 10°-35° and the second angle is between approximately 10°-35°, the second angle being different than the first angle.

9. The method of building the sensor of claim 1, wherein the building of the dielectric structure includes building the dielectric structure to a thickness between approximately 0.1 mm-1.5 mm.

10. The method of building the sensor of claim 1, wherein at least one of the building of the first conductive substrate, the building of the second conductive substrate, or the building of the dielectric structure includes building a plurality of layers, respective layers of the plurality of layers having a height between approximately 0.06 mm 0.10 mm.

11. The method of building the sensor of claim 1, further including building first electrical connectors in the first conductive substrate and building second electrical connectors in the second conductive substrate.

12. The method of building the sensor of claim 1, further including using a nozzle having a diameter of between approximately 0.8 mm-1.0 mm to deposit one or more layers of at least one of the first conductive substrate, the second conductive substrate, or the dielectric structure.

13. The method of building the sensor of claim 1, wherein the building of the first latticed structure includes building a first hourglass shape and the building of the second latticed structure includes building a second hourglass shape.

14. A non-transitory machine readable medium comprising executable instructions that, when executed, cause a 3D printer to at least:
build a first conductive substrate;
build a second conductive substrate; and
build a dielectric structure between the first conductive substrate and the second conductive substrate, the dielectric structure including:
a first latticed structure including a first plurality of legs extending inwardly at a first angle, the first latticed structure having a first stiffness in a first direction and a second stiffness in a second direction different than the first direction, the second stiffness different than the first stiffness; and
a second latticed structure including a second plurality of legs extending inwardly at a second angle, the second angle different than the first angle, the first and second latticed structure having a third stiffness in a third direction and a fourth stiffness in a fourth direction different than the third direction, the fourth stiffness different than the third stiffness.

15. The non-transitory machine readable medium of claim 14, wherein the instructions cause the 3D printer to build the dielectric structure by building first unit cells having a first structure to form the first latticed structure and building second unit cells having a second structure to form the second latticed structure, the second structure different from the first structure.

16. The non-transitory machine readable medium of claim 14, wherein the instructions cause the 3D printer to:
build the first latticed structure by building a first lower portion, a first middle portion, and a first upper portion, lateral dimensions of the first middle portion smaller than lateral dimensions of the first lower portion, and
the lateral dimensions of the first middle portion smaller than lateral dimensions of the first upper portion; and
build the second latticed structure by building a second lower portion, a second middle portion, and a second upper portion, lateral dimensions of the second middle portion smaller than lateral dimensions of the second lower portion, and
the lateral dimensions of the second middle portion smaller than lateral dimensions of the second upper portion.

17. The non-transitory machine readable medium of claim 14, wherein the instructions cause the 3D printer to:
build the first latticed structure by building a first hourglass shape; and
build the second latticed structure by building a second hourglass shape.

18. The non-transitory machine readable medium of claim 14, wherein the instructions cause the 3D printer to:
build the first latticed structure by building a first base structure, a first top structure, and a plurality of first legs extending between the first base structure and the first top structure, the plurality of first legs extending inwardly by a first angle from a vertical toward a first center portion between the first base structure and the first top structure; and
build the second latticed structure by building a second base structure, a second top structure, and a plurality of second legs extending between the second base structure and the second top structure, the plurality of second legs extending inwardly by a second angle from a vertical toward a second center portion between the second base structure and the second top structure.

19. The non-transitory machine readable medium of claim 18, wherein the first angle is between approximately 10°-35° and the second angle is between approximately 10°-35°, the second angle being different than the first angle.

20. The non-transitory machine readable medium of claim 14, wherein the instructions further cause the 3D printer to:
build first electrical connectors in the first conductive substrate; and build second electrical connectors in the second conductive substrate.

21. The non-transitory machine readable medium of claim 14, wherein the instructions further cause the 3D printer to cause one or more layers of at least one of the first conductive substrate, the second conductive substrate, or the dielectric structure to be deposited from a nozzle having a diameter of between approximately 0.8 mm-1.0 mm.

* * * * *

UNITED STATES PATENT AND TRADEMARK OFFICE
CERTIFICATE OF CORRECTION

PATENT NO. : 10,542,624 B2
APPLICATION NO. : 16/401469
DATED : January 21, 2020
INVENTOR(S) : Todd Sean Harple, Francis Anthony Bitonti and Peter Emery Wildfeuer Page 1 of 1

It is certified that error appears in the above-identified patent and that said Letters Patent is hereby corrected as shown below:

In the Claims

Column 21, Line 22 (Claim 14): after "the first angle," delete "first"

Column 21, Line 23 (Claim 14): before "second," delete "and"

Signed and Sealed this
Seventeenth Day of March, 2020

Andrei Iancu
*Director of the United States Patent and Trademark Office*